(12) United States Patent
Kawamoto et al.

(10) Patent No.: US 6,684,168 B1
(45) Date of Patent: Jan. 27, 2004

(54) BODY DISPLACEMENT AND VIBRATION ANALYSIS METHOD

(75) Inventors: Atsushi Kawamoto, Aichi-ken (JP); Mizuho Inagaki, Aichi-ken (JP); Takayuki Aoyama, Aichi-ken (JP); Nobuyuki Mori, Aichi-ken (JP); Kimihiko Yasuda, Nagoya (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 09/552,728

(22) Filed: Apr. 19, 2000

(30) Foreign Application Priority Data

Apr. 20, 1999 (JP) .............................. 11-112674

(51) Int. Cl.[7] .............................................. G06F 17/00
(52) U.S. Cl. ....................................................... 702/56
(58) Field of Search ................................ 702/33, 56, 36, 702/39, 54, 75, 76, 103, 113, 150, 152, 159, 183, 182, 141; 364/578; 73/579; 367/127; 369/247; 342/95, 77

(56) References Cited

U.S. PATENT DOCUMENTS

| | | | | |
|---|---|---|---|---|
| 3,597,598 A | * | 8/1971 | Mcallister | 235/150 |
| 4,592,034 A | * | 5/1986 | Sachse et al. | 367/127 |
| 4,870,588 A | * | 9/1989 | Merhav | 364/453 |
| 5,163,015 A | * | 11/1992 | Yokota | 364/578 |
| 5,342,017 A | * | 8/1994 | McCalmont et al. | 248/632 |
| 5,360,080 A | * | 11/1994 | Yamazaki | 180/300 |
| 5,400,033 A | * | 3/1995 | Hablani | 342/95 |
| 5,533,399 A | * | 7/1996 | Gibson et al. | 73/579 |
| 5,539,678 A | * | 7/1996 | Tanaka et al. | 364/561 |
| 5,625,575 A | * | 4/1997 | Goyal et al. | 364/578 |
| 5,831,164 A | * | 11/1998 | Reddi et al. | 73/514 |
| 5,915,278 A | * | 6/1999 | Mallick | 73/658 |

FOREIGN PATENT DOCUMENTS

JP          8-82571     *   3/1996

* cited by examiner

*Primary Examiner*—John Barlow
*Assistant Examiner*—Tung S Lau
(74) *Attorney, Agent, or Firm*—Oblon, Spivak, McClelland, Maier & Neustadt, P.C.

(57) ABSTRACT

Local observer frame LOC which is located near a body and moving on a global coordinate system is used for locally observing the body together with the global coordinate system. The rigid body displacement and elastic vibration of the body are represented by rigid body modes and elastic modes respectively, and analyzed by modal analysis uniformly handling these rigid body modes and elastic modes.

17 Claims, 12 Drawing Sheets

MOTION OF BODY-FIXED COORDINATE SYSTEM

MOTION OF LOCAL OBSERVER FRAME

| PARAMETER | VALUE | UNIT |
|---|---|---|
| MASS: $m_i$ (i = 1, ···, 7) | 1.0 | kg |
| LENGTH: $l_i$ (I = 1, 2) | 1.0 | m |
| DIAMETER OF DISK: D | 2.0 | m |
| GRAVITY: g | 9.8 | m/s$^2$ |
| START TIME: sT | 0.0 | s |
| END TIME: eT | 2.0 | s |
| TIME STEP: dt | 0.002 | s |

Fig. 12

| PARAMETER | VALUE | UNIT |
|---|---|---|
| ANGLE AROUND y-AXIS: $\theta_y$ | $\pi/36$ | rad |
| ANGULAR VELOCITY AROUND y-AXIS: $\omega_y$ | $0.1\pi$ | rad/s |
| ANGULAR VELOCITY AROUND z-AXIS: $\omega_z$ | $10.0\pi$ | rad/s |

Fig. 13

| PARAMETER | VALUE | UNIT |
|---|---|---|
| Young's MODULUS: E | $2.058 \times 10^{11}$ | N/m$^2$ |
| Poisson RATIO: $\nu$ | 0.28 | — |
| DIAMETER OF CROSS SECTION: d | $4.0 \times 10^{-2}$ | m |
| AREA OF CROSS SECTION: A | $1.2566 \times 10^{-3}$ | m$^2$ |
| MOMENT OF INERTIA: $I_{xx}$, $I_{yy}$ | $1.2566 \times 10^{-9}$ | m$^4$ |
| TORSION SPRING CONSTANT: J | $2.51327 \times 10^{-7}$ | m$^4$ |

DIRECTION OF CHAIN MOTION

BODY DISPLACEMENT AND VIBRATION ANALYSIS METHOD

BACKGROUND OF THE INVENTION

1. Field of the Invention

This invention relates to a technique for analyzing the rigid body displacement and the elastic vibration of a body on a global coordinate system. The rigid body displacement is displacement of the body as a rigid body, and the elastic vibration is vibration of the body as an elastic body.

2. Description of the Related Art

An important object in the design of machines having moving parts, such as automobile engines, is the reduction of vibration and noise. A more practical technique for analyzing vibration and noise with a higher accuracy is therefore desired. However, the currently employed technique of analyzing vibration of a single machine element based on its vibration transfer characteristics using multi-purpose structure analysis software has been developed to near the practical use. In recent years attention has therefore been focused on development of techniques for more accurately analyzing vibration by taking into consideration interaction among a plurality of machine elements.

One of the important factors for analyzing the interaction among a plurality of machine elements is analysis of the coupling of the rigid body displacement and elastic vibration of a moving part as a body. One theory based on multibody dynamics has been postulated as one method for resolving this subject. This multibody dynamics theory was initially applied to a plurality of rigid bodies connected to one another at articulations and was integrated into a single expression using differential algebraic equations in which connection by articulation is given by constraint expressions. This multibody dynamics theory has been applied not only to rigid bodies, but also to elastic bodies by representing the elastic vibration of a body by the synthesis of elastic modes. In this multibody dynamics theory, the position of a body, direction, and elastic vibration are represented by Cartesian coordinates, Euler parameters, and modal coordinates respectively. Modal coordinates, which are used for modal analysis of elastic vibration, are defined by a plurality of modal vectors orthogonal to one another.

In the conventional body displacement-vibration analysis method based on this multibody dynamics theory, however, a plurality of different coordinate systems are used in equations of motion describing the rigid body displacement and elastic vibration of a body. This results in a high probability that, in the above equations of motion, the number of coupling terms will increase or each coupling term will become complicated, by the coupling of rigid body motion and elastic vibration. Use of this conventional body displacement-vibration analysis method therefore results in the equations of motion for analyzing the rigid body displacement and elastic vibration of a body being very complicated, such that many processes requiring a relatively long time to calculate are necessary.

Moreover, while this conventional body displacement-vibration analysis method is suitable for cases where lower-order effects of elastic vibration is considered in the motion of mechanism with multiple articulations, it is not suitable in many cases where the effect of rigid body displacement is considered in elastic vibration with a large degree of elastic freedom.

SUMMARY OF THE INVENTION

Under these circumstances, the present invention is made to provide a technique for analyzing the rigid body displacement and elastic vibration of a body suitable for cases where the effect of rigid body displacement is considered in elastic vibration with many degrees of elastic freedom. Aspects of the present invention are described below to facilitate understanding of the technical features of the present invention and provide example combinations. It should be understood that the technical features in the present specification and their combinations are not limited to these examples.

In a method according to one aspect of the present invention, a moving local observer frame located at least near a body is used as a coordinate system for observing the body independently of a global coordinate system. The local observer frame differs from the conventional body-fixed coordinate system which is fixed to a body and which must continually move along with the rigid body displacement of the body. The local observer frame must only be located relatively near the body which it observes locally.

With this method, the condition upon which modal analysis of rigid body displacement of a body is based, that the rigid body displacement is infinitesimal, will be readily met.

With this method, vibration analysis can be easily performed not only when rigid body displacement is small, but also when displacement is large.

For example, in order to analyze vibration noise of an automobile engine, it is important to consider that during engine rotation the rigid body displacement of a crank shaft relative to its cylinder blocks occurs, that an oil film is formed between bearings of these cylinder blocks and a pin on the crank shaft, that this oil film functions as a non-linear spring, and so on. In this example, the rigid body displacement of the crank shaft to the cylinder blocks is significantly large in comparison to the elastic vibration of the crank shaft. This method can be applied to vibration analysis in this example.

When analysis of displacement-vibration is performed in this way, the results obtained are usually fed back to the design of an engine to improve the structure of the crank shaft and bearings. In addition, the data will be used in the design of a suitable structure for fitting the engine onto a body and so on.

Moreover, this method can be applied to vibration analysis of a single body, such as that of a gyroscope described below, and to vibration analysis of a plurality of bodies having interaction, such as that of an engine in the above example, where the displacement of cylinder blocks to a body occurs and the displacement of a crank shaft to the cylinder blocks occurs.

That the local observer frame be located at least near a body is a requirement according to modal analysis of the rigid body displacement of a body in order to fulfill the condition that rigid body displacement be infinitesimal. For example, it can be defined as the requirement that the relative displacement of a body to a local observer frame (individual displacement vector u described below, for example) be within a infinitesimal range, or as the requirement that a body and a local observer frame substantially match.

In this method, the rigid body displacement of a body may or may not be influenced by the elastic vibration of the body. If the influence exists, rigid body displacement must be decided with analyses of the elastic vibration taken into consideration; if the influence does not exist, it is possible to decide rigid body displacement independently of analyses of the elastic vibration. Therefore, if the rigid body displacement of a body is influenced by the elastic vibration of the body, the motion of a local observer frame must be defined with the elastic vibration of the body taken into consideration, but if the rigid body displacement of a body is not influenced by the elastic vibration of the body, the motion of a local observer frame can be defined independently of the elastic vibration of the body.

Furthermore, it may be preferable that a local observer frame moves substantially along with the rigid body displacement of a body at the beginning of each observation period (start time) and moves in accordance with a function of time, independently of the rigid body displacement of the body, during each observation period except the start time. Because the local observer frame moves substantially the same as a body at the beginning of each observation period, it can be located near the body to observe the body locally during each observation period.

With this method, therefore, the modal analysis condition that rigid body displacement is infinitesimal will be readily met.

With this method, vibration analysis can be performed easily on a body regardless as to whether the rigid body displacement is small or large.

A function of time should be set so that, during each observation period after commencement, a local observer frame is located near a body so that the above condition that rigid body displacement be infinitesimal is fulfilled.

Furthermore, in this method the term "periodically" is intended to include not only cases where the length of each observation period is constant, but also cases where the length of the observation period changes.

It may also be preferable that equations of motion describing a body are solved with modal coordinates as general ones to analyze the rigid body displacement and elastic vibration of the body. Meanwhile, a local observer frame moves in accordance with a function of time, independently of the rigid body displacement of the body, during each observation period except its beginning. In the equations of motion describing the body, therefore, variables related to the motion of the local observer frame can be handled as constants for the modal coordinates, which makes it easy to calculate the rigid body displacement and elastic vibration of the body with the equations of motion.

An example "equation of motion" as referred to herein is Lagrange's equation of motion. Modal coordinates are generally defined as coordinates defined by a plurality of orthogonal mode vectors.

It may also be preferable that modal analysis should be performed with modal coordinates defined by a plurality of mode vectors orthogonal to one another. With this method, therefore, the number of coupling terms arising between rigid body modes and elastic modes in equations of motion describing a body can be reduced easily or the coupling terms can be simplified easily, resulting in easy calculation with equations of motion.

Of course "mode vectors" may be normal mode vectors but they may be other mode vectors. For example, they may be static correction mode vectors, which include attachment mode vectors and constraint mode vectors.

This invention also relates to recording media on which is recorded a program which, when executed on a computer, will perform the steps of a body displacement-vibration analysis method as described herein.

Such recording media include floppy disks, magnetic tapes, magnetic disks, magnetic drums, magnetic cards, optical disks, optical magnetic disks, ROMs, CD-ROMs, IC cards, and punch tapes.

Furthermore, this invention also relates to an apparatus for analyzing the above displacement-vibration of a body.

BRIEF DESCRIPTION OF THE DRAWINGS

FIG. 12 is a table listing parameters of the analysis model.

FIG. 13 is a table listing initial conditions of the analysis model.

DESCRIPTION OF THE PREFERRED EMBODIMENT

With reference to the drawings, an example preferred embodiment of the present invention will be described below in detail.

This embodiment is a body displacement-vibration analysis method for analyzing the rigid body displacement and elastic vibration of a body. This method is suitable for analyzing vibration noise of a machine with a small degree of rigid body freedom, but a large degree of elastic freedom.

This embodiment is constructed based on various new theories. These new theories will be described below.

1. Introduction of a Local Observer Frame

Figure 1:
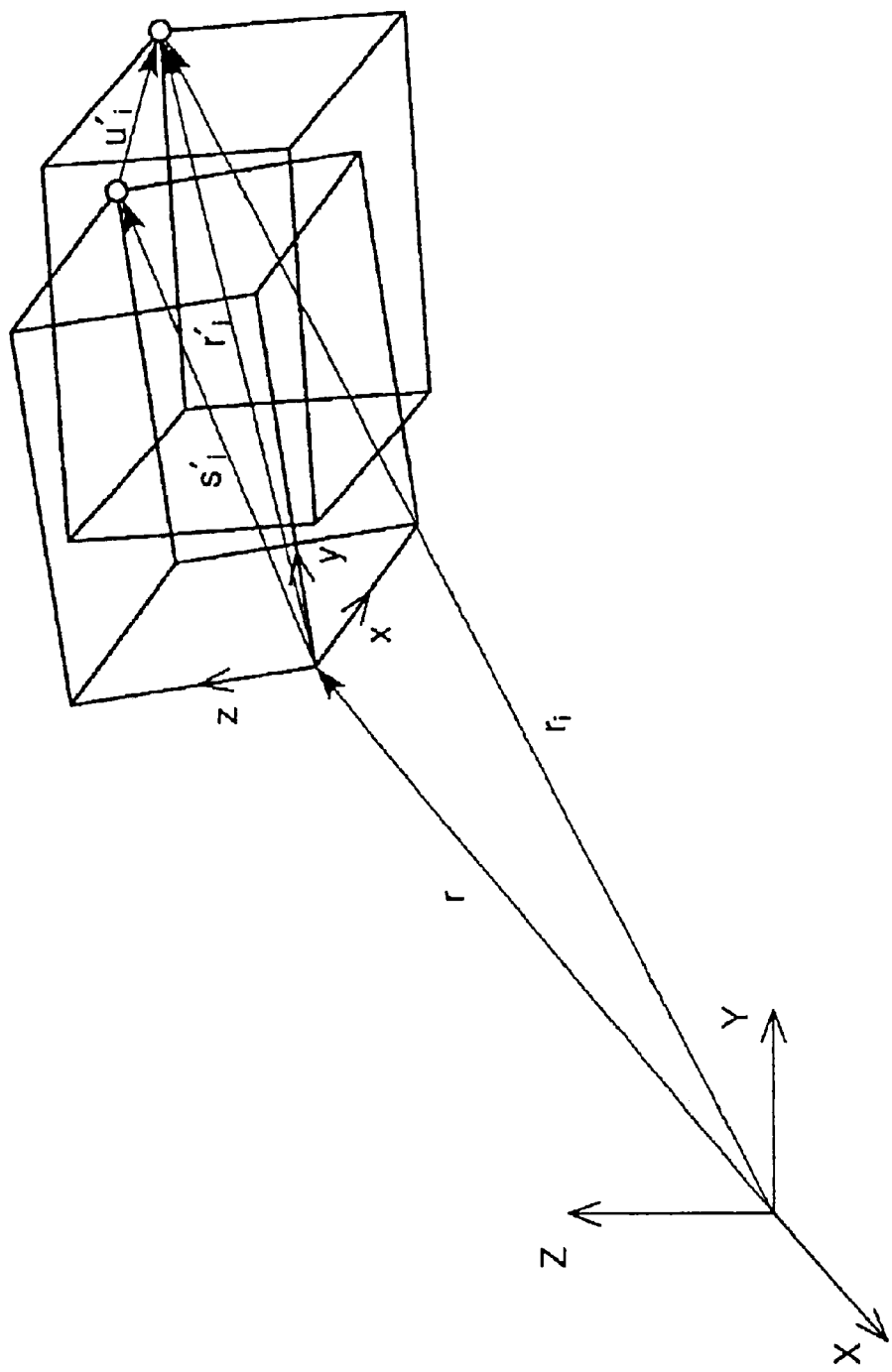
FIG. 1 is a perspective view showing a global coordinate system and a local observer frame used in a body displacement-vibration analysis method in one embodiment of the present invention.
Figure 2:
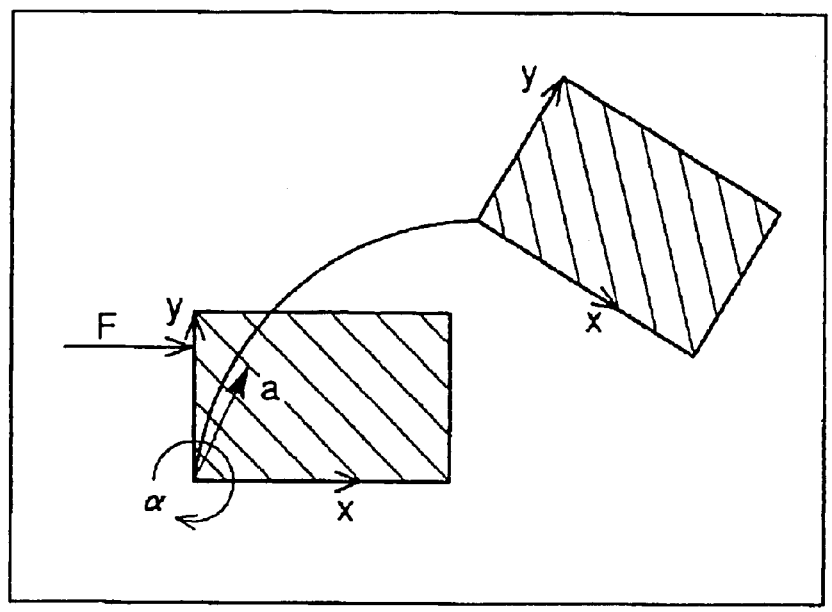
FIG. 2 is a front view for describing the motion of a conventional body-fixed coordinate system.
Figure 3:
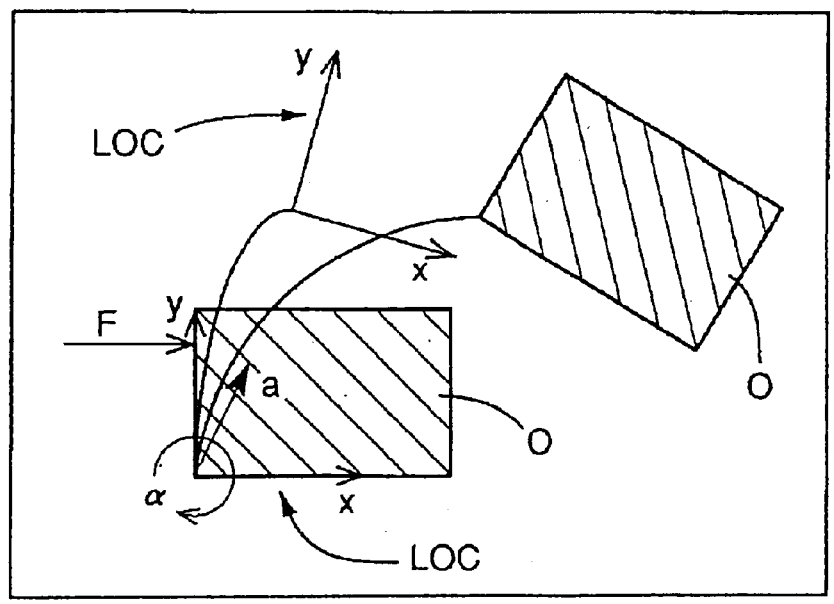
FIG. 3 is a front view for describing the motion of the local observer frame in FIG. 1.

As shown in FIG. 1, a new coordinate system based on the concept of "local observer frame $\{x, y, z\}$" is introduced to the global coordinate system $\{X, Y, Z\}$. This new coordinate system differs from a conventional body-fixed coordinate system shown in FIG. 2, in that it is only located near a body and observes the motion of the body locally. As shown in FIG. 3, local observer frame LOC moves along with body O at a certain time, and deviates from this condition over time independently of the motion of body O according to a function of time.

The relative position, velocity, and acceleration between a local observer frame and a body are described below.

First, as shown in FIG. 1, position vector $r_i$ of nodal point i of a body with respect to the global coordinate system is given by:

[Formula 1]

$$r_i = r + A r'_i \tag{1}$$

where r is the position vector of the origin of a local observer frame with respect to the global coordinate system, A is a direction cosine matrix, and $r'_i$ is the position vector of nodal point i of the body with respect to the local observer frame.

By way of supplementary explanation, the above direction cosine matrix A is a kind of coordinate transformation matrix for transforming the coordinate system from local observer frames to the global coordinate system. "'" of the above position vector $r'_i$ indicates that the vector is defined on a local observer frame and this sign will be used for other variables. N nodal points are given to a body in order to virtually divide the body into a plurality of elements. The above nodal point i represents any of the N nodal points.

If the rigid body displacement and elastic vibration of a body are not taken into consideration, the following formula will be obtained:

[Formula 2]

$$r'_i = s'_i + u'_i \tag{2}$$

where $s'_i$ is the position vector of nodal point i with respect to the local observer frame and individual displacement vector $u'_i$ is the sum of the rigid body displacement and elastic vibration. In this case, the entire displacement vector u' of N nodal points can be defined with "T" representing matrix transportation by:

[Formula 3]

$$u' = [u'^T_1 \ u'^T_2 \ldots u'^T_N]^T \tag{3}$$

If entire displacement vector u' is small enough to fall within a infinitesimal displacement range as a condition for modal analysis, and entire displacement vector u' can be represented by the synthesis of n orthonormal natural mode vectors $\emptyset_j$ (mode order $j=1, \ldots n$) including not only elastic modes but also rigid body modes, entire displacement vector u' can be given with modal displacement $q_j$ by:

[Formula 4]

$$u' = \sum_{j=1}^{n} \phi_j q_j \tag{4}$$

If mode matrix $\Phi$ is defined with natural mode vector $\emptyset_j$ by:

[Formula 5]

$$\Phi = [\phi_1 \ \phi_2 \ldots \phi_n] \tag{5}$$

mode matrix $\Phi$ has the following relations with mass matrix M and stiffness matrix K because of the orthogonality of the natural mode:

[Formula 6]

$$\Phi^T M \Phi = I \tag{6}$$

[Formula 7]

$$\Phi^T K \Phi = \lambda \tag{7}$$

where "I" is an identity matrix and "$\lambda$" is a diagonal matrix with eigenvalue $\lambda_j$ as a diagonal element such as:

[Formula 8]

$$\lambda = \begin{bmatrix} \lambda_1 & 0 & \cdots & 0 \\ 0 & \lambda_2 & \cdots & 0 \\ \vdots & \vdots & \ddots & \vdots \\ 0 & 0 & \cdots & \lambda_n \end{bmatrix} \tag{8}$$

However, if mode order $j=1, \ldots, n_r$ represents rigid body modes, eigenvalue $\lambda_j = 0$ ($j=1, \ldots, n_r$). If modal displacement vector q is defined with "$^T$" representing matrix transposition by:

[Formula 9]

$$q = [q_1 \ q_2 \ldots q_n]^T \tag{9}$$

the above formula (4) is transformed with the above formula (5) to:

[Formula 10]

$$u' = \Phi q \tag{10}$$

If natural mode vector $\emptyset_j$ is represented by $\emptyset_{ij}$ by dividing at each nodal point i like the relation between entire displacement vector u' and individual displacement vector $u'_i$ in the above formula (3) and is defined by:

[Formula 11]

$$\phi_j = [\phi_{1j}^T \phi_{2j}^T \ldots \phi_{Nj}^T]^T \tag{11}$$

individual displacement vector $u'_i$ in the above formula (2) is represented by:

[Formula 12]

$$u'_i = \sum_{j=1}^{n} \phi_{ij} q_j \tag{12}$$

The above formula (1) therefore is transformed with the above formulae (2) and (12) to:

[Formula 13]

$$r_i = r + A\left(s'_i + \sum_{j=1}^{n} \phi_{ij} q_j\right) \tag{13}$$

"$r_i$" in this formula (13) is the same as that shown in FIG. 1. This formula (13) also corresponds to a relational formula about position between the local observer frame and the body.

By differentiating the above formula (13) over time, the following relational formula about velocity between the local observer frame and the body is obtained:

[Formula 14] (14)

$$r_i^{\cdot} = r^{\cdot} + A^{\cdot}\left(s_i' + \sum_{j=1}^{n} \phi_{ij}q_j\right) + A\sum_{j=1}^{n} \phi_{ij}q_j^{\cdot}$$

where "A·" is obtained by differentiating direction cosine matrix A over time and "q·$_j$" is obtained by differentiating modal displacement q$_j$ over time.

If the angular velocity vector of the local observer frame with respect to the global coordinate system and its skew symmetric matrix are represented by ω and ω★ respectively, the following relationship can be obtained:

[Formula 15]

$$A^{\cdot} = \omega^* A \quad (15)$$

By substituting this formula (15) into the above formula (14) and newly representing the velocity vector of the local observer frame with respect to the global coordinate system by v, the following relational formula concerning velocity is obtained:

[Formula 16] (16)

$$r_i^{\cdot} = v + \omega^* A\left(s_i' + \sum_{j=1}^{n} \phi_{ij}q_j\right) + A\sum_{j=1}^{n} \phi_{ij}q_j^{\cdot}$$

By differentiating the above formula (14) over time, the following relational formula concerning acceleration between the local observer frame and the body is obtained:

[Formula 17] (17)

$$r_i^{\cdot\cdot} = r^{\cdot\cdot} + A^{\cdot\cdot}\left(s_i' + \sum_{j=1}^{n} \phi_{ij}q_j\right) + 2A^{\cdot}\sum_{j=1}^{n} \phi_{ij}q_j^{\cdot} + A\sum_{j=1}^{n} \phi_{ij}q_j^{\cdot\cdot}$$

where "A·⋅" is obtained by differentiating the above A· over time and "q·⋅$_j$" is obtained by differentiating the above q·$_j$ over time. By again differentiating the above formula (15) over time, the following formula is obtained:

[Formula 18]

$$A^{\cdot\cdot} = \omega^{\cdot *}A + \omega^* A^{\cdot} \quad (18)$$

where "ω·★" is obtained by differentiating skew symmetric matrix ω★ over time. By substituting the above formula (15) into this formula (18) and representing the angular acceleration vector of the local observer frame with respect to the global coordinate system and its skew symmetric matrix by α and α★ respectively, the following formula is obtained:

[Formula 19]

$$A^{\cdot\cdot} = (\alpha^* + \omega^*\omega^*)A \quad (19)$$

By substituting this formula (19) and the above formula (15) into the above formula (17) and newly representing the acceleration vector of the local observer frame with respect to the global coordinate system by a, the following formula is obtained:

[Formula 20] (20)

$$r_i^{\cdot\cdot} = a + (\alpha^* + \omega^*\omega^*)A\left(s_i' + \sum_{j=1}^{n} \phi_{ij}q_j\right) + 2\omega^* A\sum_{j=1}^{n} \phi_{ij}q_j^{\cdot} + A\sum_{j=1}^{n} \phi_{ij}q_j^{\cdot\cdot}$$

Thus, by introducing a local observer frame {x, y, z}, the above formulae (13), (16), and (20) were obtained as those describing the position, velocity, and acceleration of nodal point i of a body including not only elastic vibration but also rigid body displacement with the global coordinate system, the local observer frame, and the modal coordinate system.

In addition, variables defined on the global coordinate system or the local observer frame in these three formulae are defined as functions of time independently of the rigid body displacement of a body, as described below. That is to say, these variables may be considered as time-dependent variables. Meanwhile, the equation of motion of a body adopted in this embodiment will use modal coordinates as general coordinates, as described below. The above time-dependent variables can therefore be handled as constants in the equation of motion with respect to general coordinates. From this point of view, the above three formulae may be considered, by introducing a local observer frame, as those which make it possible to incorporate the position, velocity, and acceleration of nodal point i of a body including not only elastic vibration, but also rigid body displacement into the above equation of motion only with the modal coordinate system or as those which make it possible to transform a coordinate system for describing the position, velocity, and acceleration from the global coordinate system and the local observer frame to the modal coordinate system.

2. Derivation of an Equation of Motion in the Modal Coordinate System

Kinetic energy T of the whole body is given with the mass of nodal point i as m$_i$ by:

[Formula 21] (21)

$$T = \frac{1}{2}\sum_{i=1}^{n} m_i r_i^{\cdot T} r_i^{\cdot}$$

Strain energy U of the whole body arising from elastic deformation is given with entire displacement vector u' in the above formula (3) by:

[Formula 22]

$$U = \tfrac{1}{2} u'^T K u' \quad (22)$$

By substituting the above formula (10) into this formula (22), the following formula is obtained:

[Formula 23]

$$U = \tfrac{1}{2} q^T \Phi^T K \Phi q \quad (23)$$

Furthermore, by using the relation represented by the above formula (7), the following formula is obtained:

[Formula 24]

$$U = \tfrac{1}{2} q^T \lambda q \quad (24)$$

Meanwhile, by representing Lagrange's equation of motion with modal coordinate q$_k$ (mode order k=1, . . . , n$_r$) as a general coordinate, the following formula is obtained:

[Formula 25] (25)

$$\frac{d}{dt}\left(\frac{\partial T}{\partial q_k^\bullet}\right) - \frac{\partial T}{\partial q_k} + \frac{\partial U}{\partial q_k} = Q_k$$

This formula (25) is not time-dependent, and therefore is not influenced by the motion of a local observer frame which follows a function of time independently of the motion of the body. This formula (25) can therefore be solved without taking into consideration the motion of the local observer frame.

"$Q_k$" of the right side in the above formula (25) represents generalized force in the modal coordinate system.

A variable in the braces in the first term of the left side is represented with the above formula (21) by:

[Formula 26] (26)

$$\frac{\partial T}{\partial q_k^\bullet} = \sum_{i=1}^{N} m_j r_i^{\bullet T} \frac{\partial r_i^\bullet}{\partial q_k^\bullet}$$

This formula (26) is transformed with the above formula (16) to:

[Formula 27] (27)

$$\frac{\partial T}{\partial q_k^\bullet} = \sum_{i=1}^{N} m_i r_i^{\bullet T} A_{\phi ik}$$

By transposing and arranging, the following formula is obtained:

[Formula 28] (28)

$$\frac{\partial T}{\partial q_k^\bullet} = \sum_{i=1}^{N} m_{i\phi ik}^T A^T r_i^\bullet$$

By differentiating this formula (28) over time and arranging the result with the above formula (15), the following formula is obtained:

[Formula 29] (29)

$$\frac{d}{dt}\left(\frac{\partial T}{\partial q_k^\bullet}\right) = \sum_{i=1}^{N} m_{i\phi ik}^T A^T r_i^\bullet + \sum_{i=1}^{N} m_{i\phi ik}^T A^T \omega^{*T} r_i^\bullet$$

The second term of the left side in the above formula (25) is represented with the above formula (21) by:

[Formula 30] (30)

$$\frac{\partial T}{\partial q_k} = \sum_{i=1}^{N} m_i r_i^{\bullet T} \frac{\partial r_i^\bullet}{\partial q_k}$$

This formula (30) is transformed with the above formula (16) to:

[Formula 31] (31)

$$\frac{\partial T}{\partial q_k} = \sum_{i=1}^{N} m_i r_i^{\bullet T} \omega^* A_{\phi ik}$$

By transposing and arranging, the following formula is obtained:

[Formula 32] (32)

$$\frac{\partial T}{\partial q_k} = \sum_{i=1}^{N} m_{i\phi ik}^T A^T \omega^{*T} r_i^\bullet$$

The term of the right side in this formula (32) is the same as the second term of the right side in the above formula (29).

By subtracting the formula (32) from the formula (29), the following formula is obtained:

[Formula 33] (33)

$$\frac{d}{dt}\left(\frac{\partial T}{\partial q_k^\bullet}\right) - \frac{\partial T}{\partial q_k} = \sum_{i=1}^{N} m_{i\phi ik}^T A^T r_i^\bullet$$

By substituting the above formula (20) into this formula (33), the following formula is obtained:

[Formula 34] (34)

$$\frac{d}{dt}\left(\frac{\partial T}{\partial q_k^\bullet}\right) - \frac{\partial T}{\partial q_k} =$$

$$\sum_{i=1}^{N} m_{i\phi ik}^T A^T a + \sum_{i=1}^{N} m_{i\phi ik}^T A^T (\alpha^* + \omega^* \omega^*) A \left(s_i' + \sum_{j=1}^{n} \phi_{ij} q_j\right) +$$

$$2\sum_{i=1}^{N} m_{i\phi ik}^T A^T \omega^* A \sum_{j=1}^{n} \phi_{ij} q_j^\bullet + \sum_{i=1}^{N} m_{i\phi ik}^T A^T A \sum_{j=1}^{n} \phi_{ij} q_i^{\bullet\bullet}$$

Direction cosine matrix A is an orthonormal matrix, so the following relation is obtained:

[Formula 35]

$$A^T A = | \qquad (35)$$

And the condition of the orthogonality of the normal mode represented by the above formula (6) is given with mass $m_i$ of nodal point i by:

[Formula 36] (36)

$$\sum_{i=1}^{N} m_i \phi_{ik}^T \phi_{ij} = \delta_{kj}$$

where "$\delta_{kj}$" is Kronecker's delta. The above formula (34) is transformed with this formula (36) and the above formula (35) to:

[Formula 37] (37)

$$\frac{d}{dt}\left(\frac{\partial T}{\partial \dot{q}_k}\right) - \frac{\partial T}{\partial q_k} =$$

$$\sum_{i=1}^{N} m_i \phi_{ik}^T A^T a + \sum_{i=1}^{N} m_i \phi_{ik}^T A^T (\alpha^* + \omega^* \omega^*) A \left( s_i' + \sum_{j=1}^{n} \phi_{ij} q_j \right) +$$

$$2 \sum_{i=1}^{N} m_i \phi_{ik}^T A^T \omega^* A \sum_{j=1}^{n} \phi_{ij} \dot{q}_j + \ddot{q}_k$$

The third term of the left side in the above formula (25) is represented with the above formulae (24) and (8) by:

[Formula 38] (38)

$$\frac{\partial U}{\partial q_k} = \lambda_k q_k$$

For generalized force $Q_k$ of the right side in the above formula (25), virtual work $\delta W$ is considered first with external force acting on nodal point i with respect to the global coordinate system as $F_i$ and the following formula is used:

[Formula 39] (39)

$$\delta W = \sum_{i=1}^{N} F_i^T \delta r_i$$

where "$\delta r_i$" represents a infinitesimal virtual change in the above position vector $r_i$. This formula (39) is transformed with the above formula (13) to:

[Formula 40] (40)

$$\delta W = \sum_{i=1}^{N} F_i^T A \sum_{j=1}^{n} \phi_{ij} \delta q_j$$

where "$\delta q_j$" represents a infinitesimal virtual change in the above modal displacement $q_j$. If the coefficient of infinitesimal change $\delta q_j$ is put together and the following formula is defined:

[Formula 41] (41)

$$\delta W = \sum_{j=1}^{n} Q_j \delta q_j$$

then generalized force $Q_k$ is given by:

[Formula 42] (42)

$$Q_k = \sum_{j=1}^{N} F_i^T A \phi_{ik}$$

By transposing and arranging, the following formula is obtained:

[Formula 43] (43)

$$Q_k = \sum_{j=1}^{N} \phi_{ik}^T A^T F_i$$

By substituting the above formulae (37), (38), and (43) into the above formula (25), that is to say, into Lagrange's equation of motion and arranging it, the following formula is finally obtained as the equation of motion described by the modal coordinate system:

[Formula 44] (44)

$$\ddot{q}_k + \sum_{i=1}^{N} m_i \phi_{ik}^T A^T a + \sum_{i=1}^{N} m_i \phi_{ik}^T A^T (\alpha^* + \omega^* \omega^*) A \left( s_i' + \sum_{j=1}^{n} \phi_{ij} q_j \right) +$$

$$2 \sum_{i=1}^{N} m_i \phi_{ik}^T A^T \omega^* A \sum_{j=1}^{n} \phi_{ij} \dot{q}_j + \lambda_k q_k = \sum_{i=1}^{N} \phi_{ik}^T A^T F_i$$

In this formula (44) there exist terms "$\phi_{ij} q_j$" and "$\phi_{ij} \dot{q}_j$," which are coupling terms representing the coupling of vibrations between different normal modes. Compared with analysis of the same vibration noise problem by the above conventional body displacement-vibration analysis method, the number of the coupling terms is smaller and the terms are simpler.

3. Update of Local Observer Frame

A local observer frame is introduced into this embodiment, as described above. However, if this local observer frame continues to be used at the same position, then the assumption that individual displacement vector $u'_i$ in the above formula (2) is infinitesimal becomes incorrect over time. In this embodiment, therefore, the local observer frame will be suitably updated in order to maintain a infinitesimal individual displacement vector $u'_i$. The method for ensuring such is described below.

(1) Definition of Signs

Figure 4:
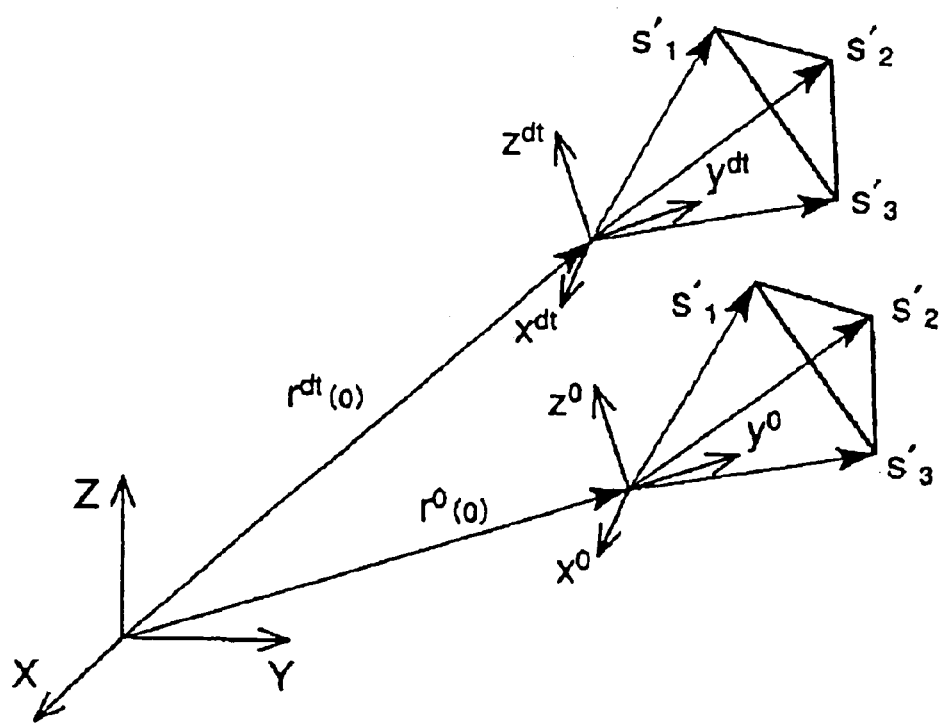
FIG. 4 is a perspective view illustrating the updating of the local observer frame shown in FIG. 1 by the body displacement-vibration analysis method.

FIG. 4 shows local observer frame $\{x^0, y^0, z^0\}$ at time 0 and local observer frame $\{x^{dt}, y^{dt}, z^{dt}\}$ at dt second after time 0 (hereinafter referred to as "time dt"). At time 0, the motion of a local observer frame and that of a body match perfectly. With this time as a data point, the local observer frame moves in accordance with a function of time independently of the motion of the body.

In the present embodiment, a local observer frame moves between time 0 and time dt, that is to say, during one observation period except its beginning (start time), such that the magnitude of at least one of the displacement, attitude, velocity, angular velocity, acceleration, and angular acceleration of the local observer frame or the magnitude of any of a set of the displacement and attitude of the local observer frame, a set of the displacement, attitude, velocity, and angular velocity of the local observer frame, and a set of the displacement, attitude, velocity, angular velocity, acceleration, and angular acceleration of the local observer frame continues to be substantially equal to that of a body at time 0. If a local observer frame is, for example, in uniform acceleration and uniform angular acceleration motion, then functions of time defining the motion of the local observer frame are, for example, the below formula (86) for the velocity of the local observer frame, (87) for its position, and (88) for its angular velocity.

In the above description, "substantially equal" is intended to include, not only cases where the local observer frame and body match completely, but also cases where the local observer frame is updated so that displacement $u'_i$ becomes infinitesimal. In cases of the latter, displacement, velocity, and acceleration in a rigid body mode on the updated local observer frame are not zero and processes for calculating them are therefore necessary.

The acceleration vector, velocity vector, position vector, angular acceleration vector, angular velocity vector, and direction cosine matrix of a local observer frame at time dt are represented by $a^0(dt)$, $v^0(dt)$, $r^0(dt)$, $\alpha^0(dt)$, $\omega^0(dt)$, and $A^0(dt)$ respectively. At time dt, the local observer frame is updated. The acceleration vector, velocity vector, position vector, angular acceleration vector, angular velocity vector, and direction cosine matrix of this new local observer frame respectively represented by $a^{dt}(0)$, $v^{dt}(0)$, $r^{dt}(0)$, $\alpha^{dt}(0)$, $\omega^{dt}(0)$, and $A^{dt}(0)$ are found.

The superscripts of the above variables or functions of various kinds indicate that the variables or functions are determined at that time.

(2) Update related to position vector $r^{dt}(0)$ of the origin of a local observer frame Position vector $r^{dt}(0)$ of the origin of the new local observer frame at time dt is updated as given with the above formula (13) and the origin (i =0) taken into consideration by:

[Formula 45] (45)
$$r^{dt}(0) = r^0(dt) + A^0(dt)\sum_{j=1}^{n_r} \phi_{0j}q_j$$

where mode order j=1, . . . , $n_r$ represent rigid body modes and "$\varnothing_{0j}$" represents the normal mode vector of a nodal point corresponding to the origin of the local observer frame among the plurality of nodal points of a body. The meaning of "a nodal point corresponding to the origin" will be described below.

(3) Update related to velocity vector $v^{dt}(0)$ of the origin of a local observer frame Velocity vector $v^{dt}(0)$ of the origin of the new local observer frame at time dt is updated as given with the above formula (16) by:

[Formula 46] (46)
$$v^{dt}(0) = v^0(dt) + \omega^{*0}(dt)A^0(dt)\sum_{j=1}^{n_r} \phi_{0j}q_j + A^0(dt)\sum_{j=1}^{n_r} \phi_{0j}\dot{q}_j$$

(4) Update related to acceleration vector $a^{dt}(0)$ of the origin of a local observer frame Acceleration vector $a^{dt}(0)$ of the origin of the new local observer frame at time dt is updated as given with the above formula (20) by:

[Formula 47] (47)
$$a^{dt}(0) = a^0(dt) + (\alpha^{*0}(dt) + \omega^{*0}(dt)\omega^{*0}(dt))A^0(dt)\sum_{j=1}^{n_r}\phi_{0j}q_j +$$
$$2\omega^{*0}(dt)A^0(dt)\sum_{j=1}^{n_r}\phi_{0j}\dot{q}_j + A^0(dt)\sum_{j=1}^{n_r}\phi_{0j}\ddot{q}_j$$

(5) Update of direction cosine matrix $A^{dt}(0)$

Position vector $r^{dt}_i$ of nodal point i at time dt with respect to the global coordinate system is given with the above formula (13) used and the rigid body displacement of a body not taken into consideration by:

[Formula 48] (48)
$$r^{dt}_i = r^0(dt) + A^0(dt)\left(s'_i + \sum_{j=1}^{n_r}\phi_{ij}q_j\right)$$

Vector $s^{dt}_i$ corresponding to the above position vector $s'_i$ at time dt with respect to the global coordinate system is given by:
[Formula 49]

$$s^{dt}_i = r^{dt}_i - r^{dt}(0) \quad (49)$$

By substituting the above formulae (45) and (48) into this formula (49), the following formula is obtained:

[Formula 50] (50)
$$s^{dt}_i = A^0(dt)\left(s'_i + \sum_{j=1}^{n_r}(\phi_{ij} - \phi_{0j})q_j\right)$$

The above vector $s^{dt}_i$ is represented with direction cosine matrix $A^{dt}(0)$ at time dt by:
[Formula 51]

$$s^{dt}_i = A^{dt}(0)s'_i \quad (51)$$

In order to solve this formula (51) on direction cosine matrix $A^{dt}(0)$, three nodal points are selected among the plurality of nodal points of a body so that they form a tetrahedron together with the origin of the local observer frame and three vectors $s'_1$, $s'_2$, and $s'_3$ with the origin as an initial point and each nodal point as a terminal point are linearly independent of one another, as shown in FIG. 4. This selection gives:
[Formula 52]

$$[s^{dt}_1\ s^{dt}_2\ s^{dt}_3] = A^{dt}(0)\ [s'_1\ s'_2\ s'_3] \quad (52)$$

where "$s'_1$," "$s'_2$," and "$s'_3$" represent three vectors in FIG. 4 respectively, which have an initial point of the origin and a terminal point of nodal points 1, 2, and 3 respectively and are linearly independent of one another. Thus vectors $s'_1$, $s'_2$, and $s'_3$ are linearly independent of one another, so a matrix with vectors $s'_1$, $s'_2$, and $s'_3$ as components has an inverse matrix. Direction cosine matrix $A^{dt}(0)$ in the above formula (52) therefore can be updated as given by:
[Formula 53]

$$A^{dt}(0) = [s^{dt}_1\ s^{dt}_2\ s^{dt}_3]\ [s'_1\ s'_2\ s'_3]^{-1} \quad (53)$$

(6) Update of Skew Symmetric Matrix $\omega\bigstar^{dt}(0)$ of Angular Velocity Velocity component $r^{\cdot dt}_i$ of nodal point i at time dt resulting from the rigid body displacement of a body is given with the above formula (16) by:

[Formula 54] (54)

$$r^{\cdot dt}_i = v^0(dt) + \omega^{*0}(dt) A^0(dt)\left(s'_i + \sum_{j=1}^{n_r} \phi_{ij} q_j\right) + A^0(dt)\sum_{j=1}^{n_r} \phi_{ij} q^{\cdot}_j$$

Vector $s^{\cdot dt}_i$ obtained by differentiating vector $s^{dt}_i$ over time does not have any translational velocity component with respect to the global coordinate system and is therefore given by:

[Formula 55]

$$s^{\cdot dt}_i = r^{\cdot dt}_i - v^{dt}(0) \quad (55)$$

By substituting the above formulae (46) and (54) into this formula (55), the following formula is obtained:

[Formula 56] (56)

$$s^{\cdot dt}_i = \omega^{*0}(dt) A^0(dt)\left(s'_i + \sum_{j=1}^{n_r} (\phi_{ij} - \phi_{0j})q_j\right) + A^0(dt)\sum_{j=1}^{n_r} (\phi_{ij} - \phi_{0j})q^{\cdot}_j$$

In addition, vector $s^{\cdot dt}_i$ is represented with the above formula (53) and skew symmetric matrix $\omega\bigstar^{dt}(0)$ at time dt by:

[Formula 57]

$$s^{\cdot dt}_i = \omega^{*dt}(0) A^{dt}(0) s'_i \quad (57)$$

As with the above formula (53), therefore, the following formula is obtained with the above vectors $s'_1$, $s'_2$, and $s'_3$ being linearly independent of one another:

[Formula 58]

$$[s^{\cdot dt}_1 \, s^{\cdot dt}_2 \, s^{\cdot dt}_3] = \omega^{*dt}(0) A^{dt}(0)[s'_1 \, s'_2 \, s'_3] \quad (58)$$

Skew symmetric matrix $\omega\bigstar^{dt}(0)$ of angular velocity therefore is updated as given by:

[Formula 59]

$$\omega^{*dt}(0) = [s^{\cdot dt}_1 \, s^{\cdot dt}_2 \, s^{\cdot dt}_3][s'_1 \, s'_2 \, s'_3]^{-1} A^{dt}(0)^{-1} \quad (59)$$

(7) Update of Skew Symmetric Matrix $\alpha\bigstar^{dt}(0)$ of Angular Acceleration Acceleration component $r^{\cdot\cdot dt}_i$ of nodal point i at time dt resulting from the rigid body displacement of a body is given with the above formula (20) by:

[Formula 60] (60)

$$r^{\cdot\cdot dt}_i = a^0(dt) + (\alpha^{*0}(dt) + \omega^{*0}(dt)\omega^{*0}(dt))A^0(dt)\left(s'_i + \sum_{j=1}^{n_r} \phi_{ij} q_j\right) +$$

$$2\omega^{*0}(dt) A^0(dt)\sum_{j=1}^{n_r} \phi_{ij} q^{\cdot}_j + A^0(dt)\sum_{j=1}^{n_r} \phi_{ij} q^{\cdot\cdot}_j$$

"$s^{\cdot\cdot dt}_i$" does not have any translational acceleration component with respect to the global coordinate system and therefore is given by:

[Formula 61]

$$s^{\cdot\cdot dt}_i = r^{\cdot\cdot dt}_i - a^{dt}(0) \quad (61)$$

By substituting the above formulae (47) and (60) into this formula (61), the following formula is obtained:

[Formula 62] (62)

$$s^{\cdot\cdot dt}_i = (\alpha^{*0}(dt) + \omega^{*0}(dt)\omega^{*0}(dt))A^0(dt)\left(s'_i + \sum_{j=1}^{n_r} (\phi_{ij} - \phi_{0j})q_j\right) +$$

$$2\omega^{*0}(dt) A^0(dt)\sum_{j=1}^{n_r} (\phi_{ij} - \phi_{0j})q^{\cdot}_j + A^0(dt)\sum_{j=1}^{n_r} (\phi_{ij} - \phi_{0j})q^{\cdot\cdot}_j$$

In addition, vector $s^{\cdot\cdot dt}_i$ is represented with the above formulae (53) and (59) and skew symmetric matrix $\alpha\bigstar^{dt}(0)$ of angular acceleration at time dt by:

[Formula 63]

$$s^{\cdot\cdot dt}_i = (\alpha^{*dt}(0) + \omega^{*dt}(0)\,\omega^{*dt}(0))A^{dt}(0)s'_i \quad (63)$$

As with the above formulae (53) and (58), therefore, the following formula is obtained with the above vectors $s'_1$, $s'_2$, and $s'_3$ being linearly independent of one another:

[Formula 64]

$$[s^{\cdot\cdot dt}_1 \, s^{\cdot\cdot dt}_2 \, s^{\cdot\cdot dt}_3] = (\alpha^{*dt}(0) + \omega^{*dt}(0)\omega^{*dt}(0)) A^{dt}(0) [s'_1 \, s'_2 \, s'_3] \quad (64)$$

Skew symmetric matrix $\alpha\bigstar^{dt}(0)$ of angular acceleration is therefore updated as given by:

[Formula 65]

$$\alpha^{*dt}(0) = [s^{\cdot\cdot dt}_1 \, s^{\cdot\cdot dt}_2 \, s^{\cdot\cdot dt}_3][s'_1 \, s'_2 \, s'_3]^{-1} A^{dt}(0)^{-1} - \omega^{*dt}(0)\omega^{*dt}(0) \quad (65)$$

(8) Correction of Direction Cosine Matrix $A^{dt}(0)$

In this embodiment, the rigid body displacement of a body is analyzed by synthesizing rigid body modes. In such a case, the rigid body displacement of the body is described with a modal coordinate system in which a plurality of normal mode vectors are orthogonal to one another, so direction cosine matrix $A^{dt}(0)$ found by the above formula (53) includes a minute error. The existence of this error will be concretely described below.

If the coordinate axis vectors of a local observer frame with respect to the global coordinate system are represented by $x^<$, $y^<$, and $z^<$ respectively, then direction cosine matrix A is given by:

[Formula 66]

$$A = [x^< y^< z^<] \quad (66)$$

Each coordinate axis vector is a unit vector, so the following expression can be obtained:

[Formula 67]

$$x^{<T}x^< = y^{<T}y^< = z^{<T}z^< = 1 \quad (67)$$

In addition, the three coordinate axis vectors are orthogonal to one another, so the following expression is true:

[Formula 68]

$$x^{<T}y^< = y^{<T}z^< = z^{<T}x^< = 0 \quad (68)$$

However, as column vectors of direction cosine matrix $A^{dt}(0)$ updated in accordance with the above formula (53) are $x^-$, $y^-$, and $z^-$ including slight errors, the expressions represented by the above formulae (67) and (68) are not strictly true.

In this embodiment, therefore, direction cosine matrix $A^{dt}(0)$ is corrected appropriately so that the errors are eliminated. The correction method will be described below.

First, it is assumed that the direction of column vector $x^-$ is correct and column vector $x^<$ is determined with the following formula:

[Formula 69] (69)

$$x^< = \frac{x^-}{|x^-|}$$

When the column vector $y^<$ to be found is on the plane on which column vector $x^<$ found in the manner described above and column vector $y^-$ lie and column vector $z^<$ is determined with the following formula:

[Formula 70] (70)

$$z^< = \frac{x^- X y^-}{|x^- X y^-|}$$

column vector $y^<$ is determined with the following formula:
[Formula 71]

$$y^< = z^< \times x^<$$ (71)

(9) Correction of skew symmetric matrix $\omega\star^{dt}(0)$ of angular velocity As with direction cosine matrix $A^{dt}(0)$, updated skew symmetric matrix $\omega\star^{dt}(0)$ of angular velocity $\omega$ also includes a minute error. In this embodiment, therefore, skew symmetric matrix $\omega\star^{dt}(0)$ is also corrected appropriately. The correction method is described below.

Skew symmetric matrix $\omega\star^{dt}(0)$ found by the above formula (59) is generally a full matrix, but it is originally a skew symmetric matrix of angular velocity vector $\omega$ given by:
[Formula 72]

$$\omega = [\omega_x \ \omega_y \ \omega_z]^T$$ (72)

and should fulfill the relationship given by:

[Formula 73] (73)

$$\omega^* = \begin{bmatrix} 0 & -\omega_z & \omega_y \\ \omega_z & 0 & -\omega_x \\ -\omega_y & \omega_x & 0 \end{bmatrix}$$

Each element of skew symmetric matrix $\omega\star^{dt}(0)$ including an error is given by:

[Formula 74] (74)

$$\omega^{*dt}(0) = \begin{bmatrix} \omega_{11}^- & \omega_{12}^- & \omega_{13}^- \\ \omega_{21}^- & \omega_{22}^- & \omega_{23}^- \\ \omega_{31}^- & \omega_{32}^- & \omega_{33}^- \end{bmatrix}$$

Various correction methods for skew symmetric matrix $\omega\star^{dt}(0)$ are possible, but this embodiment adopts the following method.

First, if the diagonal elements of skew symmetric matrix $\omega\star^{dt}(0)$ are not 0, then diagonal element $\omega\star_{ii}=0$ (i=1, 2, 3) with all of them as errors. Next, fundamental elements $\omega_x$, $\omega_y$, and $\omega_z$ are corrected as follows:

[Formula 75] (75)

$$\omega_x = \frac{\omega_{32}^- - \omega_{23}^-}{2}$$

[Formula 76] (76)

$$\omega_y = \frac{\omega_{13}^- - \omega_{31}^-}{2}$$

[Formula 77] (77)

$$\omega_z = \frac{\omega_{21}^- - \omega_{12}^-}{2}$$

(10) Correction of Skew Symmetric Matrix $\alpha\star^{dt}(0)$ of Angular Acceleration A correction method for skew symmetric matrix $\alpha\star^{dt}(0)$ is basically the same with that for skew symmetric matrix $\omega\star^{dt}(0)$. The method will be concretely described below.

Skew symmetric matrix $\alpha\star^{dt}(0)$ updated in accordance with the above formula (65) is generally a full matrix, but it is originally a skew symmetric matrix of angular acceleration vector given by:
[Formula 78]

$$\alpha = [\alpha_x \ \alpha_y \ \alpha_z]^T$$ (78)

and therefore should fulfill the equation:

[Formula 79] (79)

$$\alpha^* = \begin{bmatrix} 0 & -\alpha_z & \alpha_y \\ \alpha_z & 0 & -\alpha_x \\ -\alpha_y & \alpha_x & 0 \end{bmatrix}$$

Each element of skew symmetric matrix $\alpha\star^{dt}(0)$ including an error is given by:

[Formula 80] (80)

$$\alpha^{*dt} = \begin{bmatrix} \alpha_{11}^- & \alpha_{12}^- & \alpha_{13}^- \\ \alpha_{21}^- & \alpha_{22}^- & \alpha_{23}^- \\ \alpha_{31}^- & \alpha_{32}^- & \alpha_{33}^- \end{bmatrix}$$

The correction of skew symmetric matrix $\alpha\star^{dt}(0)$ is as follows: First, if the diagonal elements of skew symmetric matrix $\alpha\star^{dt}(0)$ are not 0, then diagonal element $\alpha\star_{ii}=0$ (i=1, 2, 3) with all of them as errors. Next, fundamental elements $\alpha_x$, $\alpha_y$, and $\alpha_z$ are corrected as follows:

[Formula 81] (81)

$$\alpha_x = \frac{\alpha_{32}^- - \alpha_{23}^-}{2}$$

[Formula 82] (82)

$$\alpha_y = \frac{\alpha_{13}^- - \alpha_{31}^-}{2}$$

[Formula 83] (83)

$$\alpha_z = \frac{\alpha_{21}^- - \alpha_{12}^-}{2}$$

(10) Initialization of Variables of Various Kinds in Rigid Body Modes

In this embodiment, each time local observer frame $\{x, y, z\}$ is updated, modal displacement $q_j$ (j=1, ..., $n_r$), modal velocity $q'_j$ (j=1, ..., $n_r$), and modal acceleration $q''_j$ (j=1, ..., $n_r$) in rigid body modes are all initialized to 0.

The theories adopted for constructing this embodiment have been described in detail. Now its structure will be described in detail.

Figure 5:
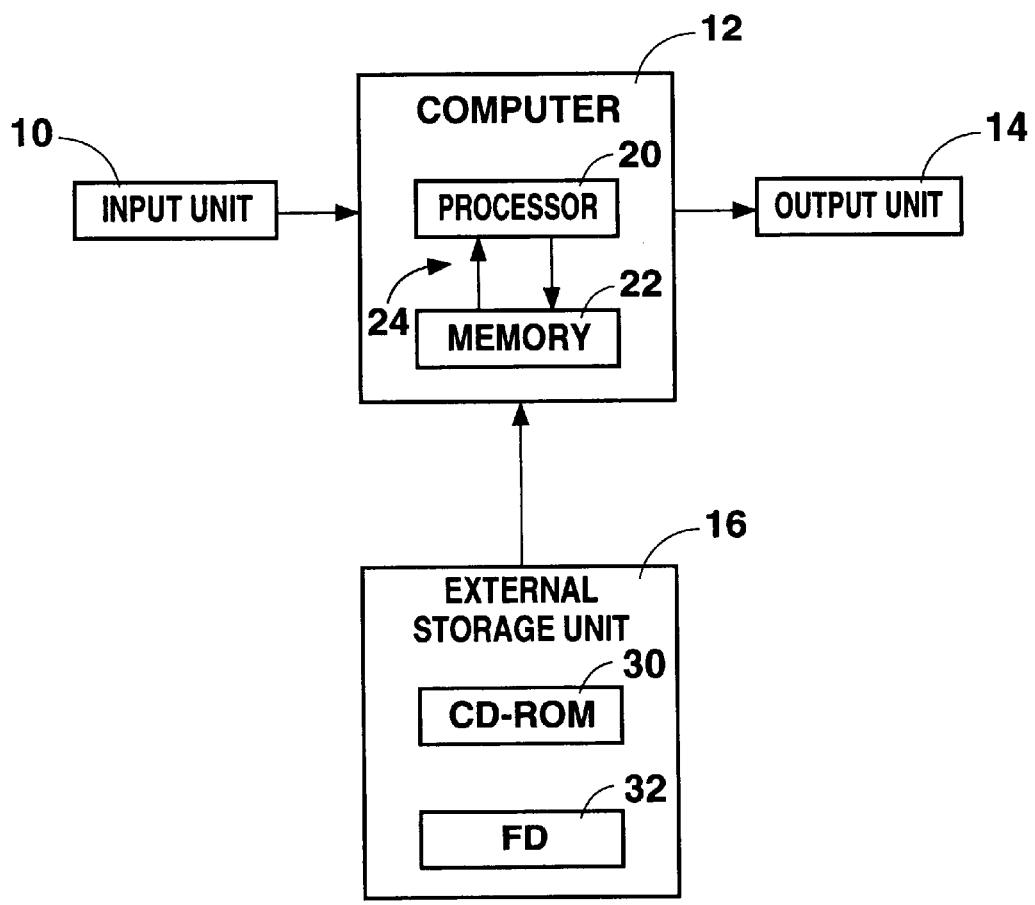
FIG. 5 is a block diagram showing a preferable body displacement-vibration analysis apparatus.

In FIG. 5, a preferable body displacement-vibration analysis apparatus (hereinafter simply referred to as "the analysis apparatus") for performing the body displacement-vibration analysis method of this embodiment is shown.

The analysis apparatus is equipped with an input unit 10, a computer 12, an output unit 14, and an external storage unit 16. The input unit 10 may be configured so that it includes a mouse, a keyboard, and so on. The computer 12 is configured so that it includes a processor 20, such as a CPU, a memory 22, such as a ROM, a RAM, and a hard disk, and a bus 24 for connecting thee processor 20 and the memory 22. The output unit 14 is configured so that it includes a display, a printer, a plotter, and so on. A recording medium such as a CD-ROM 30 and a recordable FD (flexible disk) 32 can be mounted on the external storage unit 16. When a recording medium is installed, reading and writing of data are performed as necessary.

In this embodiment, programs necessary for body displacement-vibration analysis (hereinafter simply referred to as "the vibration analysis") are stored on the CD-ROM 30 and data necessary for the vibration analysis are stored on the FD 32. The programs necessary for the vibration analysis include a modal analysis program and a vibration analysis program. For vibration analysis, necessary programs and data are read out from the CD-ROM 30 and FD 32 into a RAM or hard disk of the computer 12 and are then executed by the processor 20.

The above modal analysis program calculates eigenvalue $\lambda_j$ and normal mode vector $\emptyset_j$ of a body to be analyzed, using the finite element method. This program calculates eigenvalue $\lambda_j$ and normal mode vector $\emptyset_j$ based on data for virtually dividing the body into a plurality of elements and on data for defining the property of the body. With this program, number i of each nodal point (i=1, ..., N), coordinate $s'_i$ of each nodal point, eigenvalue $\lambda_j$ (j=1, ..., $n_r$), and normal mode vector $\emptyset_j$(j=1, ..., $n_r$) can be obtained. A program developed and sold as "MSC-NASTRAN (version 68, 69, 70)" by MSC Japan is an example of such a program.

Figure 6:
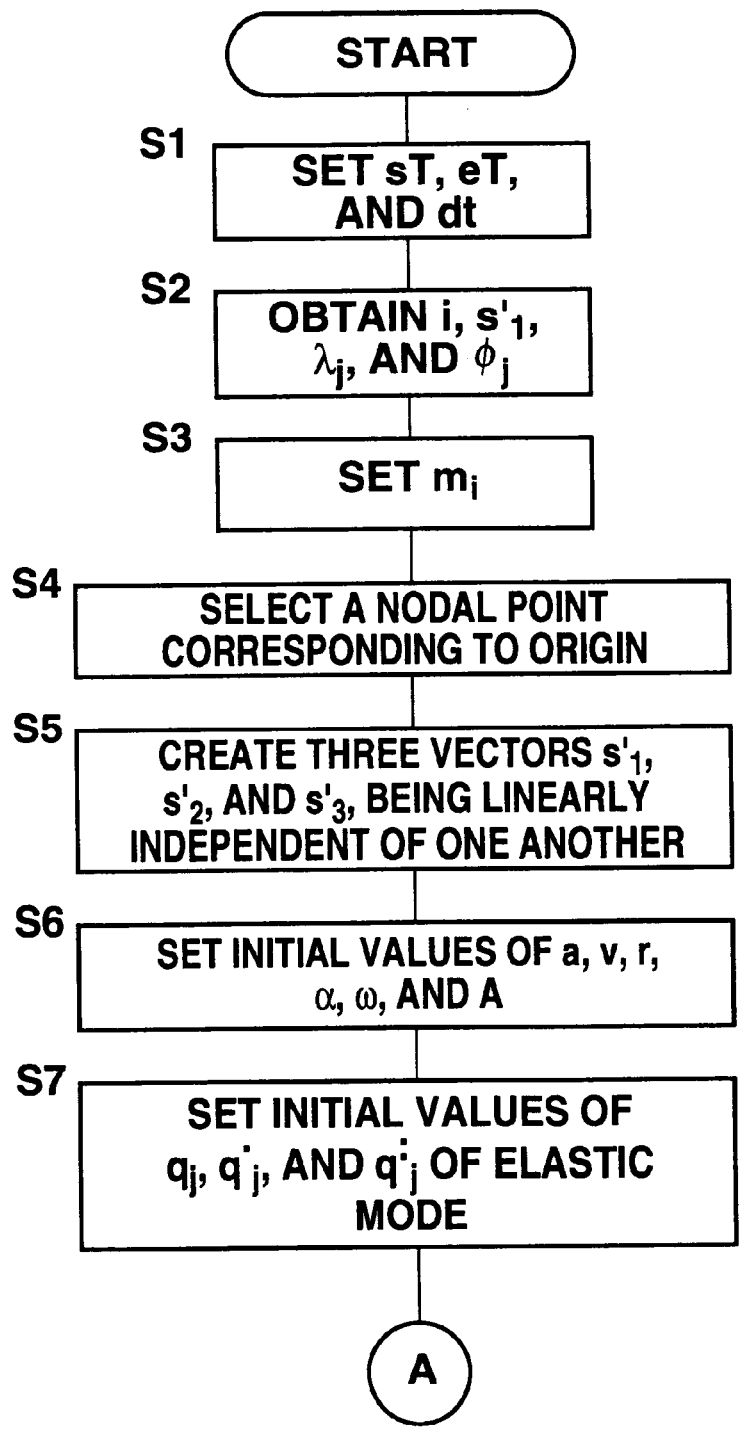
FIG. 6 is a flowchart showing a first portion of a vibration analysis program stored in the CD-ROM shown in FIG. 5.
Figure 7:
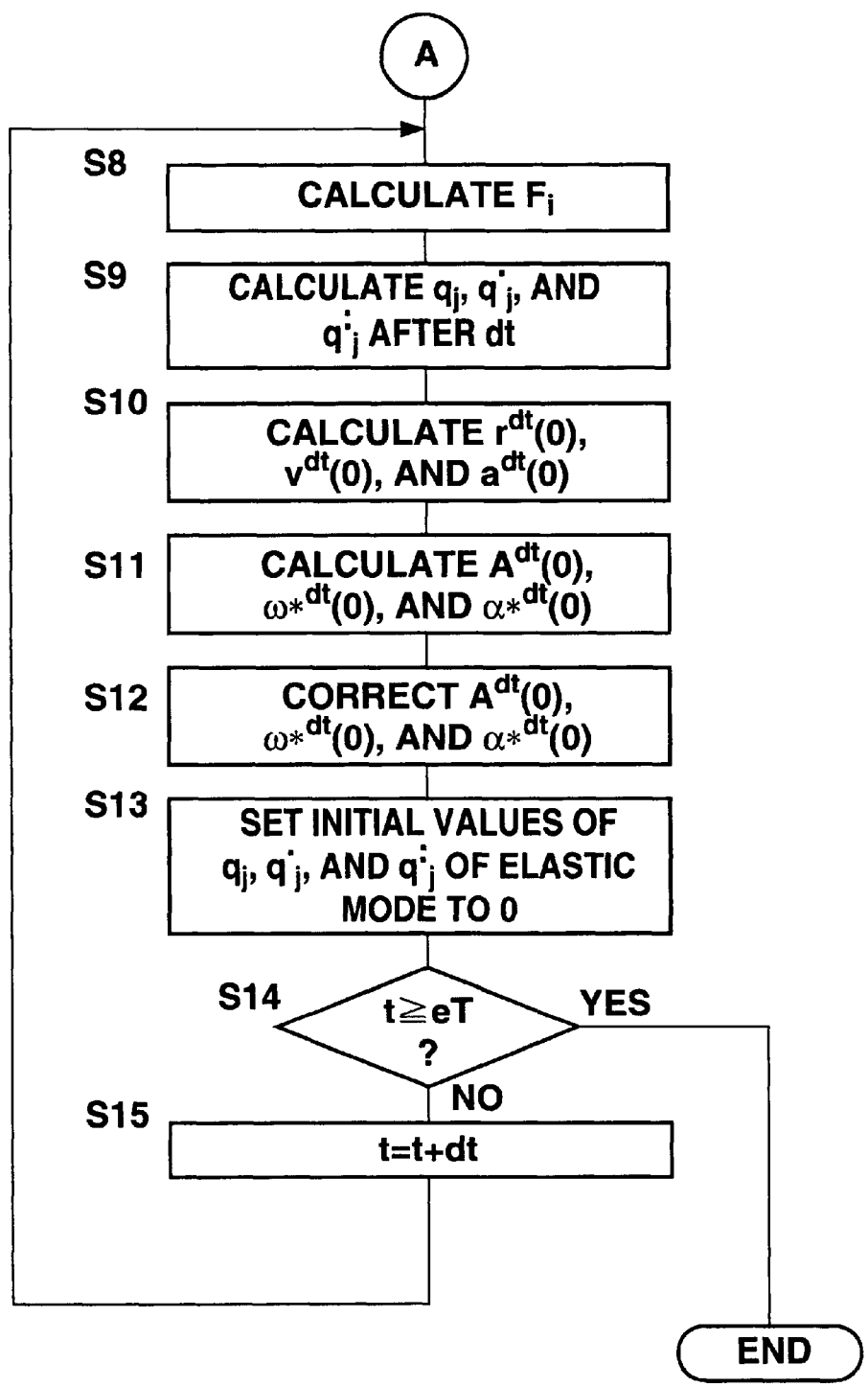
FIG. 7 is a flowchart showing a latter portion of a vibration analysis program stored in the CD-ROM shown in FIG. 5.

In FIGS. 6 and 7, the above vibration analysis program is illustrated with a flowchart. This program is designed based on the above vibration analysis theories proposed by the present inventors and the contents of each step therefore have already been described in detail. The flow with time of the body displacement-vibration analysis method of this embodiment will be described in detail with reference to the flowchart and the contents of each step will be outlined.

First, in step S1 , start time sT at which an analysis is started, end time eT at which it is ended, and time step dt by which the period between start time sT and end time eT is divided are input as the time base set for analyzing a body. As a result, an observation period for observing and analyzing the body is repeated every time step dt between start time sT and end time eT.

Next, in step S2, nodal point number i (i=1, ..., N), nodal point coordinate $s'_i$, eigenvalue $\lambda_j$ (j=1, ..., $n_r$), and normal mode vector $\emptyset_j$ are obtained by executing the modal analysis program. In step S3, mass $m_i$ for each nodal point of the body is set.

Subsequently, in step S4, a nodal point corresponding to the origin of a local observer frame at start time sT is selected from among a plurality of nodal points of the body. When there exists a nodal point matching the origin, then that nodal point is selected as the corresponding one; when no nodal point matches the origin, the body is translated on the local observer frame to match any one of the plurality of nodal points with the origin, with that nodal point then being considered as the corresponding point. In step S5, three vectors $s'_1$, $s'_2$, and $s'_3$ being linearly independent of one another are created by selecting three nodal points from among the plurality of nodal points of the body so that the three nodal points form the three vectors $s'_1$, $s'_2$, and $s'_3$ in conjunction with the origin of the local observer frame respectively.

Subsequently, in step S6, initial values of acceleration vector a, velocity vector v, position vector r, angular acceleration vector $\alpha$, angular velocity vector $\omega$, and direction cosine matrix A of the local observer frame are set. In step S7, initial values of modal displacement $q_j$, modal velocity $q'_j$, and modal acceleration $q''_j$ in an elastic mode with mode order of j of the body are set.

Subsequently, in step S8, external force $F_i$ acting on each nodal point i of the body is obtained. When this program is executed for vibration analysis of a single body, external force $F_i$ is obtained by input from the user. On the other hand, when this program is executed on each of a plurality of bodies with the interaction of force for their vibration analysis, external force $F_i$ is sequentially calculated by using the latest analysis of this program. Specifically, external force $F_i$ acting on nodal point i of a body is calculated based on at least one of relative displacement and relative displacement velocity between nodal point i of the body and nodal point i' of another body relating to the body. Relative displacement is calculated by the difference between position vector $r_i$ of each body and position vector $r_{i'}$ of another body relating to each body and relative displacement velocity is calculated as the difference between velocity vector $r'_i$ of each body and velocity vector $r'_{i'}$ of another body relating to each body. Each of position vector $r_i$ and $r_{i'}$ can be calculated by the above formula (13); each of velocity vector $r'_i$ and $r'_{i'}$, by the above formula (16); and each of acceleration vector $r''_i$ and $r''_{i'}$, by the above formula (17).

More specifically, in an example of a plurality of bodies where the interaction of forces is such that the bodies can be considered to be connected by springs, external force $F_i$ is calculated based on relative displacement corresponding to the expansion of the springs, and where the interaction of force is such that the bodies can be considered to be connected by springs and dampers, external force $F_i$ can be calculated based on relative displacement corresponding to the expansion of the springs and on relative displacement velocity corresponding to the velocity of the dampers.

Subsequently, in step S9, by integrating the above formula (44) overtime, modal displacement $q_j$, modal velocity $q'_j$, and modal acceleration $q''_j$ with mode order of j of the body at time step dt after time t=0 are calculated. These modal displacement $q_j$, modal velocity $q'_j$, and modal acceleration $q''_j$ include those arising in rigid body modes and those arising in elastic modes. Fourth-order Runge-Kutta method is an example numerical integration method for integrating the above formula (44) over time.

Subsequently, instep S10, to update the local observer frame, position vector $r^{dt}(0)$, velocity vector $v^{dt}(0)$, and acceleration vector $a^{dt}(0)$ of the local observer frame at the beginning of the next observation period are calculated as described above, while in step S11, in order to update the local observer frame, direction cosine matrix $A^{dt}(0)$, skew symmetric matrix $\omega\bigstar^{dt}(0)$ of angular velocity $\omega$, and skew symmetric matrix $\alpha\bigstar^{dt}(0)$ of angular acceleration $\alpha$ of the local observer frame at the beginning of the next observation period are also calculated as described above. In step S12, errors included in the direction cosine matrix $A^{dt}(0)$, skew symmetric matrix $\omega\bigstar^{dt}(0)$ of angular velocity $\omega$, and skew symmetric matrix $\alpha\bigstar^{dt}(0)$ of angular acceleration $\alpha$ are corrected, as described above. Then, in step S13, initial values of modal displacement $q_j$, modal velocity $q'_j$, and modal acceleration $q''_j$ in an rigid body mode with mode order of j of the body are set to 0.

Subsequently, in step S14, a decision is made as to whether present observation time t has become end time eT. When the present observation time t has not yet become end time eT, a decision of NO is made, observation time t is increased by time step dt in step S15, and the process returns to step S8. Steps S8 through S15 are repeated until the decision at step S14 is YES, upon which execution of the program finishes once.

Figure 8:
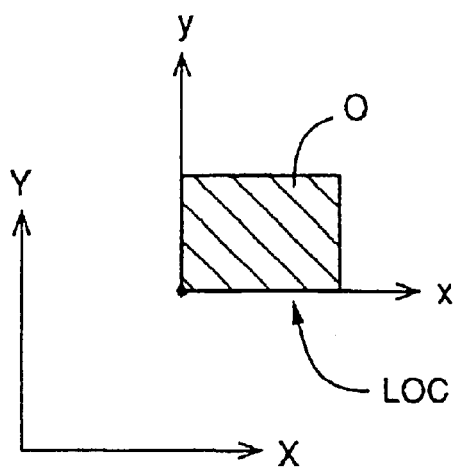
FIG. 8 is a front view illustrating the execution of the vibration analysis program shown in FIGS. 6 and 7.
Figure 9:
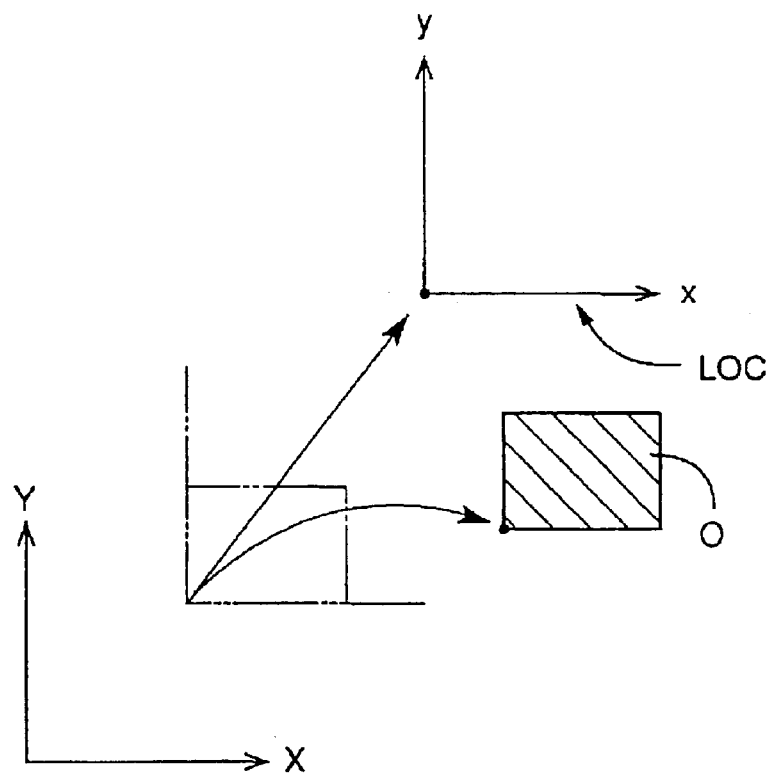
FIG. 9 is another front view illustrating the execution of the vibration analysis program shown in FIGS. 6 and 7.
Figure 10:
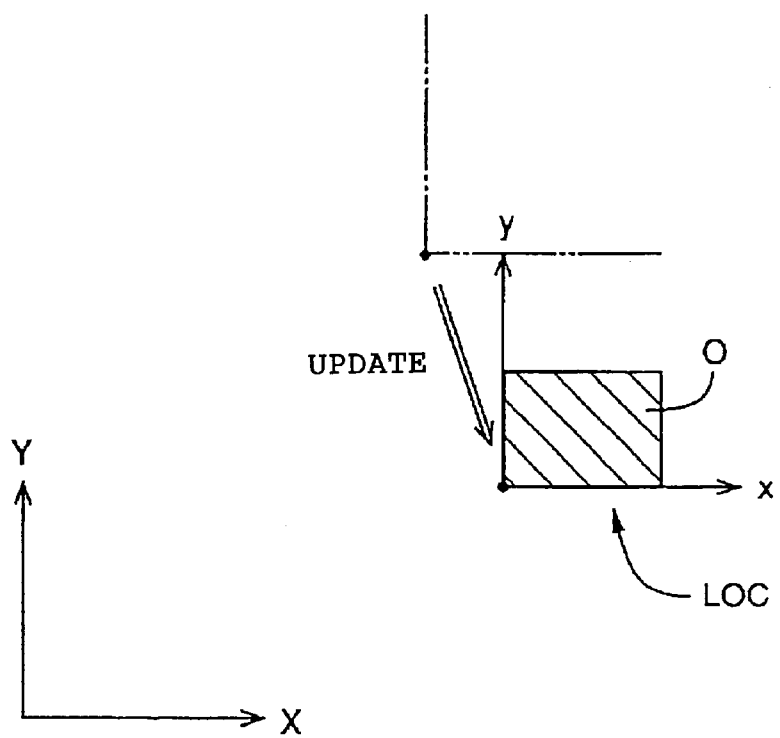
FIG. 10 is still another front view illustrating the execution of the vibration analysis program shown in FIGS. 6 and 7.

In FIGS. 8 through 10, the motion (translation and rotation) of local observer frame LOC with respect to the motion (rigid body displacement) of body O is shown.

First, at observation time t=0, local observer frame LOC moves along with body O, as shown in FIG. 8. From then on, local observer frame LOC moves independently of body O until observation time t=dt after time step dt, that is to say, during some observation period. At observation time t=dt, therefore, the motion of local observer frame LOC and body O do not necessarily match, but local observer frame LOC is always located near body O because both motions matched at the beginning of that observation period, that is to say, at observation time t=0. Therefore, if body O is seen from local observer frame LOC at observation time t=dt, the rigid body displacement of the body O becomes infinitesimal. As a result, the discussed condition necessary to apply modal analysis exists. Then, as shown in FIG. 10, the motion of local observer frame LOC is updated for the next observation so that it matches that of body O at the beginning of the next observation period, that is to say, at the end of this observation period. This processing is performed during each observation period.

The theories adopted in this embodiment and the structure of this embodiment have been described in detail. Next, the validity of the theories and structure will now be described using the vibration analysis of a gyroscope shown in FIG. 11 as an example.

1. Description of an Analysis Model

Figure 11:
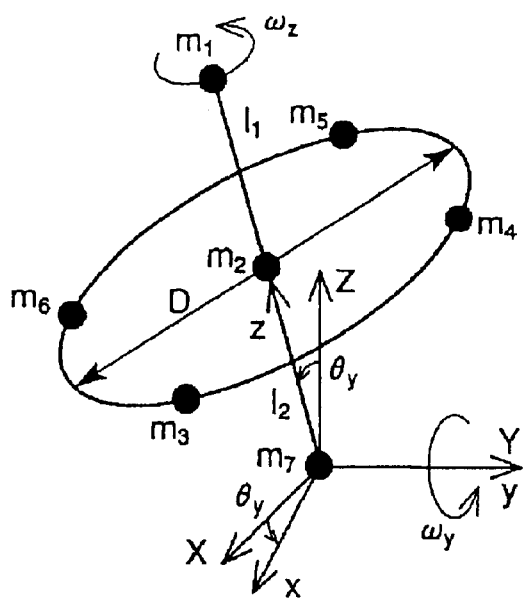
FIG. 11 is a perspective view showing an analysis model used for verifying the validity of the above body displacement-vibration analysis method.

The gyroscope shown in FIG. 11 consists of seven mass points having mass $m_i$ (i=1, ..., 7), beams with lengths of $l_1$ and $l_2$ and ignorable mass, and a disk with a diameter of D and ignorable mass. The seven mass points are arranged at the vertices and center of gravity of a regular octahedron respectively. This gyroscope is connected to the origin of the global coordinate system at mass point 7 via a spherical joint and gravity acts in −Z direction. This type of gyroscope is commonly known as a Lagrange top.

2. Definition and Update of Local Observer Frame

A local observer frame is arranged like coordinate system {x, y, z} shown in FIG. 11 in its initial state and moves at a uniform acceleration and at a uniform angular acceleration. During each observation period (t=0–dt), acceleration vector a and angular acceleration vector α are given by the following two respective formulae:

[Formula 84]

$$a^o(dt) = a^o(0) \tag{84}$$

[Formula 85]

$$\alpha^o(dt) = \alpha^o(0) \tag{85}$$

Therefore velocity vector v and position vector r can be found by the following two formulae, respectively:

[Formula 86]

$$v^o(dt) = v^o(0) + a^o(0)dt \tag{86}$$

[Formula 87]

$$r^o(dt) = r^o(0) + v^o(0)dt + \tfrac{1}{2}a^o(0)dt^2 \tag{87}$$

Similarly, angular velocity vector ω is given by:
[Formula 88]

$$\omega^o(dt) = \omega^o(0) + \alpha^o(0)dt \tag{88}$$

Direction cosine matrix A is calculated in the following way:

First, a unit vector indicating the revolution axis of the local observer frame from time 0 to time dt is represented by k; the revolution angle, by θ. Next, the revolution angle θ is considered to be infinitesimal so that the following relation will be obtained:
[Formula 89]

$$k\theta = \omega^o(0)dt + \tfrac{1}{2}\alpha^o(0)dt^2 \tag{89}$$

If rotation transformation matrix equivalent to a rotation given by "kθ" in this formula is represented by $R_{k\text{-}TH}$ and vector k is given by:
[Formula 90]

$$k = [k_x\ k_y\ k_z]^T \tag{90}$$

then rotation transformation matrix $R_{k\text{-}TH}$ is given by:

[Formula 91] (91)

$$R_{k\text{-}TH} = \begin{bmatrix} k_x k_x v_{TH} + c_{TH} & k_x k_y v_{TH} - k_z s_{TH} & k_x k_z v_{TH} + k_y s_{TH} \\ k_x k_y v_{TH} + k_z s_{TH} & k_y k_y v_{TH} + c_{TH} & k_y k_z v_{TH} - k_x s_{TH} \\ k_x k_z v_{TH} - k_y s_{TH} & k_y k_z v_{TH} + k_x s_{TH} & k_z k_z v_{TH} + c_{TH} \end{bmatrix}$$

where $c_{TH}$=COS θ, $s_{TH}$=sin θ, and $v_{TH}$=1−COS θ. And direction cosine matrix A can be calculated by:
[Formula 92]

$$A^o(dt) = R_{k\text{-}TH} A^o(0) \tag{92}$$

The local observer frame is updated in accordance with the above method and is updated every time step dt which is the same with numerical integration described below.

3. Verification of Rigid Body Displacement Calculations

First, in order to confirm that rigid body displacement can be calculated correctly according to this embodiment, calculation is performed with only rigid body modes taken into consideration. The gyroscope is connected at mass point 7 via a spherical joint, so the degree of freedom of this motion system is 3 with only rigid body modes is taken into consideration. Three revolution modes around x, y, and z axes respectively are selected as rigid body modes and normal mode vectors normalized by the above formula (6) are adopted. FIG. 12 shows parameters and constants necessary for calculation, while FIG. 13 shows initial conditions. Fourth-order Runge-Kutta method is used as a numerical integration method for the above formula (44).

Figures 14, 15:
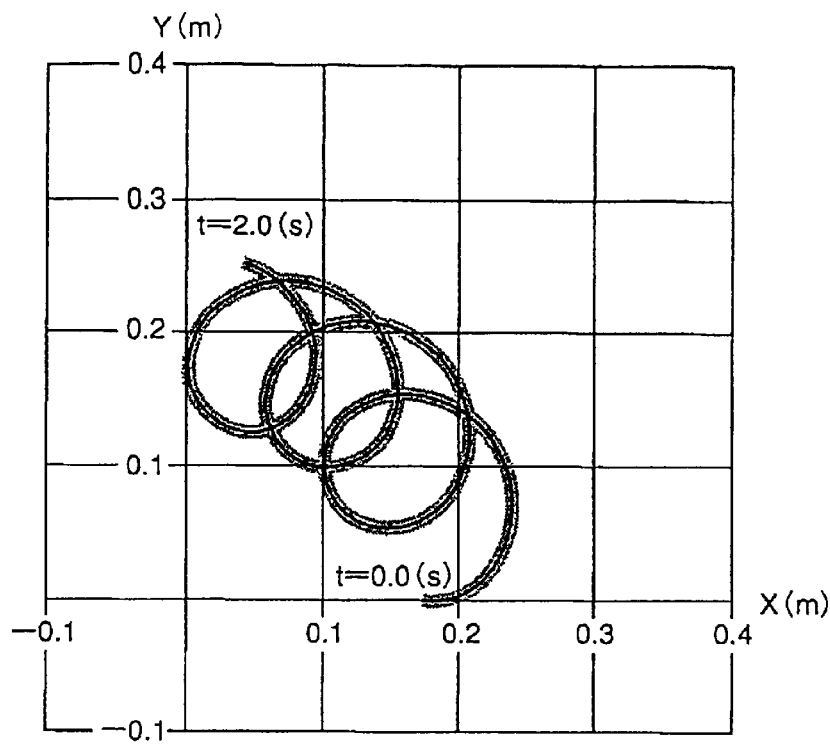
FIG. 14 is a graph comparing body displacement-vibration analyses results obtained when the analysis model is assumed to be a rigid body.
FIG. 15 is a table listing parameters of an analysis model assumed as an elastic body.

A solid-line graph in FIG. 14 is obtained by orthogonally projecting the trajectory of mass point 1 of the gyroscope calculated according to this embodiment onto XY plane. A shaded line graph in FIG. 14 shows, for comparison, the trajectory of mass point 1 calculated by Lagrange's equation of motion with Eulerian angles as general coordinates which is orthogonally projected onto XY plane. Both trajectories indicate that the gyroscope's precession exhibits nutation due to the influence of the initial angular velocity and gravity. The results of both calculations match. Meanwhile, it has been proved that the calculation results obtained by Lagrange's equation of motion with Euler angles as general coordinates match the actual values with high accuracy. This verifies that this embodiment of the present invention provides a body displacement-vibration analysis method which can correctly analyze rigid body displacement.

4. Verification of Rigid Body Displacement and Elastic Vibration Calculations Next, calculation is performed with the beams of the above gyroscope having lengths of $l_1$ and $l_2$ as elastic beams. FIG. 15 shows the various parameters of the elastic beams. In addition, two bending modes with the translational motion of the disk having a natural frequency of 34.727 Hz are adopted based on an eigen-value analysis using MSC-NASTRAN. Moreover, in addition to the conditions shown in FIG. 13, initial displacement of 0.005 is given to the two elastic modes as initial conditions.

Figure 16:
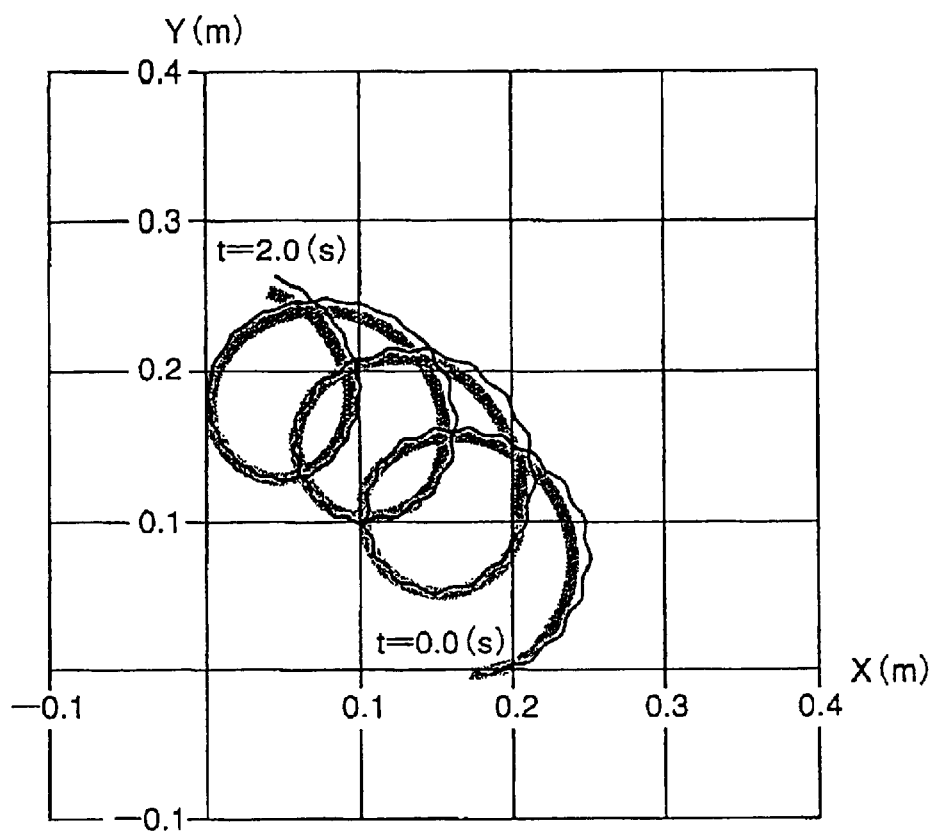
FIG. 16 is a graph comparing body displacement-vibration analyses results.

A solid-line graph as shown in FIG. 16 is obtained by orthogonally projecting the trajectory of mass point 1 of the elastic gyroscope calculated according to this embodiment onto XY plane. This trajectory indicates that the gyroscope's precession exhibits both elastic vibration and nutation. A shaded line graph in FIG. 16 shows the trajectory of mass point 1 in the case of only rigid body modes being adopted and is the same as the solid-line graph in FIG. 14. A comparison between the solid-line and shaded line graphs in FIG. 16 will show that the magnitude of the nutation is slightly different because of the elastic effect of the elastic beams. This makes it clear that this embodiment is a body displacement-vibration analysis method which can correctly calculate not only rigid body displacement but also elastic vibration.

5. Verification of Conservation of Energy

Figure 17:
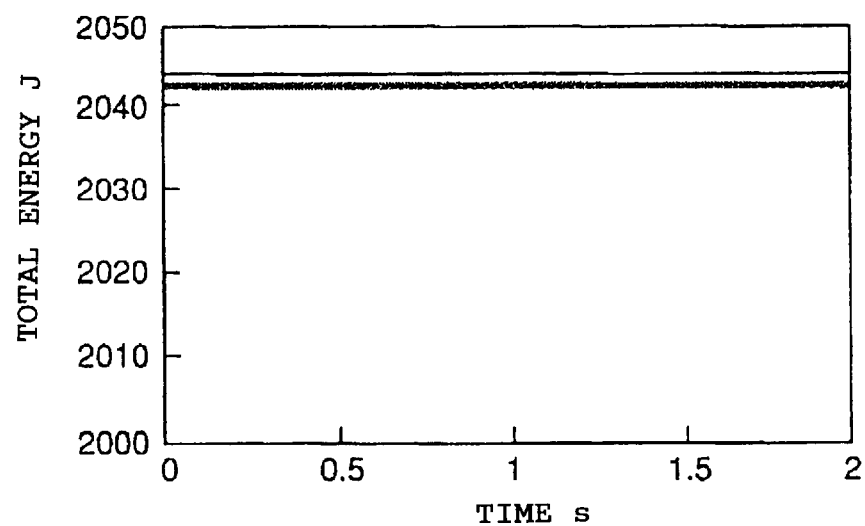
FIG. 17 is a graph illustrating the conservation of energy during displacement-vibration analysis.

Next, in order to verify the validity of this embodiment from the viewpoint of energy, FIG. 17 shows the history of a change in the total energy of the gyroscope over time. A solid-line graph and a shaded line graph in FIG. 17 show the total energy of the elastic gyroscope and rigid gyroscope respectively. These two graphs correspond to the solid-line graph and shaded line graph in FIG. 16 respectively. The difference between the results in FIG. 17 is equal to the strain energy from the initial displacement given to the elastic gyroscope. These graphs show that the total energy is conserved for both the case of the elastic gyroscope and the rigid gyroscope. This also makes it clear that this embodiment is a body displacement-vibration analysis method which can correctly calculate not only rigid body displacement, but also elastic vibration.

6. Conclusion

As can be seen from the above, the validity of this embodiment has been verified from the viewpoint of the calculation results of rigid body displacement and elastic vibration and from the viewpoint of the calculation results of the total energy.

A body displacement-vibration analysis method of an additional embodiment of the present invention will now be described. This embodiment has many elements in common with the embodiment described above, with differences only existing in elements for realizing the motion of a local observer frame. In the following, detailed description of the common elements will not be repeated and only different elements will be described in detail.

The first embodiment is an example of vibration analysis of a body the motion of which as a rigid body is not known. In such a case, a local observer frame must be successively updated to the rigid body displacement of a body. In contrast, when the motion of a body as a rigid body is known, this motion can be given to a local observer frame as a function of time, thereby obviating the need for updating the local observer frame to the rigid body displacement of the body.

Figure 18:
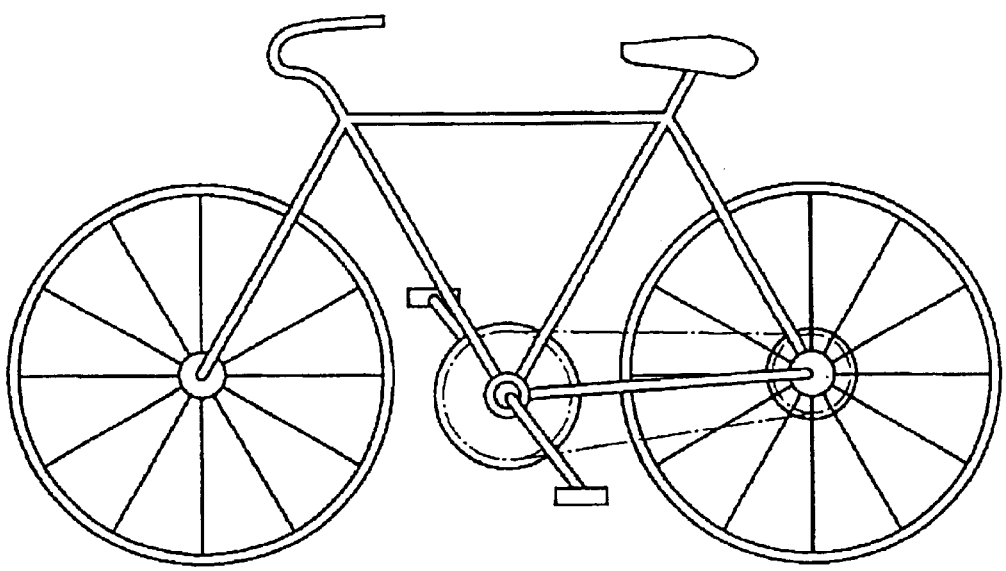
FIG. 18 is a front view showing a chain and a bicycle as a subject of vibration analysis illustrating another embodiment of the present invention.
Figure 19:
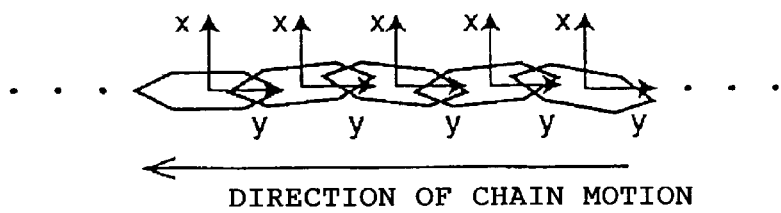
FIG. 19 is a front conceptual view of part of the chain shown in FIG. 18.

A chain fixed on a bicycle shown in FIG. 18 is an example of a body whose motion as a rigid body is known. This chain moves by pedals and along a pair of gears around which the chain is fixed. The motion of the chain is therefore restrained to a certain extent. As shown in FIG. 19, a local observer frame is set for each of a plurality of links composing the chain and connected to one another so as to be able to move and turn, and each of the plurality of local observer frames is given motion which is the same as that of the corresponding link. This will ensure that the plurality of local observer frames are located at least near the links of the chain respectively, making it unnecessary to update the local observer frames each time a vibration analysis of each link is obtained.

If analysis of displacement-vibration is performed in this manner, the results obtained can be fed back to the design of an engine. That is, a more suitable structure for a crank shaft and bearings can be obtained. In addition, this information can be used for the design of a suitable structure for fitting an engine onto a chassis and so on.

While the embodiments of the present invention have been described in detail with reference to the drawings, it is to be understand that these are examples used to illustrate the invention. The present invention can be embodied in various forms by making modifications and improvements based on knowledge of those skilled in the art, including, but not limited to, those described in the SUMMARY OF THE INVENTION.

What is claimed is:

1. A method for analyzing rigid body displacement and elastic vibration of a moving body, comprising the steps of:
   setting a global coordinate system;
   setting a local observer frame being located at least near the body and observing the body locally while moving on the global coordinate system; and
   analyzing the rigid body displacement of the body and the elastic vibration of the body by modal analysis using one set of modal coordinates as generalized coordinates;
   wherein the modal coordinates are described by using the global coordinate system and the local observer frame, and
   wherein the local observer frame is not a body-fixed frame and is independent of the rigid body displacement of the body.

2. The method according to claim 1, wherein a condition that the rigid body displacement on the local observer frame is infinitesimal is satisfied by representing the rigid body displacement of the body with the local observer frame.

3. The method according to claim 2, wherein the local observer frame is updated periodically.

4. The method according to claim 1, wherein the local observer frame moves in accordance with a function of time.

5. The method according to claim 1, wherein
the local observer frame moves substantially the same as the rigid body displacement of the body at a start time of a predetermined observation period and moves in accordance with a function of time independently of the rigid body displacement of the body during the observation period except the start time; and analysis of the rigid body displacement and elastic vibration of the body is performed during each observation period by observing the body with the local observer frame.

6. The method according to claim 1, wherein the modal analysis is performed by solving equations of motion describing the rigid body displacement and elastic vibration of the body with modal coordinates used as general coordinates.

7. The method according to claim 1, wherein the modal analysis is performed with modal coordinates defined by a plurality of mode vectors orthogonal to one another.

8. The method according to claim 1, wherein
the local observer frame moves during a predetermined observation period except a start time such that a magnitude of at least one of displacement, attitude, velocity, acceleration, angular velocity, and angular acceleration of the local observer frame continues to be substantially equal to that of the body at the start time; and the local observer frame is updated for a next observation so as to substantially match a latest analysis on the rigid body displacement of the body each time an analysis of the body is obtained at an end of each observation period.

9. The method according to claim 1, wherein the modal analysis comprises the steps of:
(i) obtaining eigenvalue $\lambda$ and n orthonormal mode vectors $\phi_j$ including rigid body modes for the modal analysis;

(ii) calculating direction cosine matrix A for transforming vectors defined on the local observer frame into vectors defined on the global coordinate system;

(iii) setting position vector r, velocity vector v, and acceleration vector a of the origin of the local observer frame on the global coordinate system at a start time of a first observation period;

(iv) obtaining external force $F_i$ acting on each of a plurality of nodal points i set on the body during each observation period;

(v) calculating modal displacement $q_j$, modal velocity $\dot{q}_j$, and modal acceleration $\ddot{q}_j$ with a mode order of j of the body on a modal coordinate system at an end of the observation period during each observation period;

(vi) calculating position vector $r^{dt}(0)$, velocity vector $v^{dt}(0)$, and acceleration vector $a^{dt}(0)$ of the origin of the local observer frame on the global coordinate system at the start time of a next observation period for a next observation during each of the observation periods; and (vii) initializing all of the modal displacement $q_j$, modal velocity $\dot{q}_j$, and modal acceleration $\ddot{q}_j$ of a rigid body mode with the mode order of j of the body to 0 for the next observation during each observation period.

10. The method according to claim 9, wherein a body displacement-vibration analysis method is used for analyzing the rigid body displacement and elastic vibration of a plurality of bodies having force interaction and wherein in the step (iv):

the external force $F_i$ acting on nodal point i of each of the bodies is calculated based on force interaction between the nodal point i and nodal point i' of a related body; and the force interaction is calculated based on at least one set of position vectors $r_i$ and $r_i'$, velocity vectors $\dot{r}_i$ and $\dot{r}_i'$, and acceleration vectors $\ddot{r}_i$ and $\ddot{r}_i'$ of the plurality of bodies on the global coordinate system with their elastic vibration not taken into consideration.

11. The method according to claim 9, wherein in the step (ii), nodal points creating three vectors $s'_1$, $s'_2$, and $s'_3$ having their initial points at a nodal point corresponding to the origin of the local observer frame and being linearly independent of one another are selected among a plurality of nodal points previously set on the body and the direction cosine matrix A is calculated based on the three vectors $s'_1$, $s'_2$, and $s'_3$ created.

12. The method according to claim 9, wherein
direction cosine matrix $A^{dt}(0)$, skew symmetric matrix $\omega^{*dt}(0)$ of angular velocity $\omega$ of the local observer frame, and skew symmetric matrix $\alpha^{*dt}(0)$ of angular acceleration $\alpha$ of the local observer frame at the start time of the next observation period are calculated for the next observation during each of the observation periods; and the calculated direction cosine matrix $A^{dt}(0)$, skew symmetric matrix $\omega^{*dt}(0)$, and skew symmetric matrix $\alpha^{*dt}(0)$ are corrected so that errors caused by the modal analysis with a modal coordinate system defined by the n orthonormal mode vectors $\phi_j$ are not included in the direction cosine matrix $A^{dt}(0)$, skew symmetric matrix $\omega^{*dt}(0)$, and skew symmetric matrix $\alpha^{*dt}(0)$.

13. The method according to claim 1, wherein a body to be analyzed is an engine and the vibration of the engine is analyzed.

14. The method according to claim 1, wherein an engine is designed with a vibration analysis of the engine.

15. The method according to claim 1, wherein a structure for fitting an engine onto a body is designed with a vibration analysis of the engine.

16. A medium having recorded thereon a program for analyzing rigid body displacement and elastic vibration of a moving body, which, when executed, causes a computer to:
set a global coordinate system;
set a local observer frame being located at least near the body and observing the body locally while moving on the global coordinate system; and
analyze the rigid body displacement of the body and the elastic vibration of the body by modal analysis using one set of modal coordinates as generalized coordinates,
wherein the modal coordinates are described by using the global coordinate system and the local observer frame, and
wherein the local observer frame is not a body-fixed frame and is independent of the rigid body displacement of the body.

17. An apparatus for analyzing rigid body displacement and elastic vibration of a moving body, comprising:
means for setting a global coordinate system;
means for setting a local observer frame being located at least near the body and observing the body locally while moving on the global coordinate system; and
means for analyzing the rigid body displacement of the body and the elastic vibration of the body by modal analysis using one set of modal coordinates as generalized coordinates, wherein the modal coordinates are described by using the global coordinate system and the local observer frame, and wherein the local observer frame is not a body-fixed frame and is independent of the rigid body displacement of the body.

* * * * *